(12) United States Patent
Balteanu et al.

(10) Patent No.: US 11,689,202 B2
(45) Date of Patent: Jun. 27, 2023

(54) VOLTAGE GENERATORS WITH CHARGE PUMPS FOR SWITCH CIRCUITS

(71) Applicant: SKYWORKS SOLUTIONS, INC., Irvine, CA (US)

(72) Inventors: Florinel G. Balteanu, Irvine, CA (US); Paul T. DiCarlo, Marlborough, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 17/539,017

(22) Filed: Nov. 30, 2021

(65) Prior Publication Data

US 2022/0085808 A1 Mar. 17, 2022

Related U.S. Application Data

(63) Continuation of application No. 15/895,890, filed on Feb. 13, 2018, now Pat. No. 11,190,182.

(Continued)

(51) Int. Cl.

| | |
|---|---|
| *H03K 17/693* | (2006.01) |
| *H04B 1/40* | (2015.01) |
| *H03K 3/356* | (2006.01) |
| *H02M 3/07* | (2006.01) |
| *H01L 23/00* | (2006.01) |

(Continued)

(52) U.S. Cl.

CPC .......... *H03K 17/693* (2013.01); *H02M 3/073* (2013.01); *H03K 3/356113* (2013.01); *H04B 1/40* (2013.01); *H01L 24/42* (2013.01); *H01L 25/0652* (2013.01); *H01L 2224/05554* (2013.01); *H01L 2224/48091* (2013.01); *H01L 2924/181* (2013.01); *H02M 3/07* (2013.01);

(Continued)

(58) Field of Classification Search
CPC ........... H03K 17/693; H03K 3/356113; H03K 17/102; H03K 2217/0081; H02M 3/073; H02M 3/07; H02M 3/077; H02M 1/0043; H04B 1/40; H01L 24/42; H01L 25/0652; H01L 2224/05554; H01L 2224/48091; H01L 2924/181

See application file for complete search history.

(56) References Cited

U.S. PATENT DOCUMENTS

| | | | | |
|---|---|---|---|---|
| 4,839,787 A * | 6/1989 | Kojima | ................. | H02M 3/073 363/60 |
| 4,962,512 A * | 10/1990 | Kiuchi | ................. | H02M 3/073 377/57 |

(Continued)

*Primary Examiner* — Jinsong Hu
*Assistant Examiner* — Rui M Hu
(74) *Attorney, Agent, or Firm* — Chang & Hale LLP

(57) ABSTRACT

Disclosed herein are non-limiting examples of voltage generators that use multiple charge pumps coupled in series to generate a targeted voltage. The charge pumps implement multiple charge pump units that reduce the introduction of noise into a circuit in which they are implemented. The charge pumps units work in parallel on different clock phases to reduce spurious noise. This is in contrast to using a single charge pump with a relatively large flying capacitor or a plurality of charge pumps in series. This can, for example, reduce spurious signals or spurs that arise due at least in part to the characteristics of the clock signal. The disclosed technologies may be particularly advantageous for SOI-based components and circuits.

20 Claims, 14 Drawing Sheets

US 11,689,202 B2
Page 2

Related U.S. Application Data

(60) Provisional application No. 62/458,461, filed on Feb. 13, 2017.

(51) Int. Cl.
  *H01L 25/065* (2023.01)
  *H03K 17/10* (2006.01)

(52) U.S. Cl.
  CPC ........... *H02M 3/077* (2021.05); *H03K 17/102* (2013.01); *H03K 2217/0081* (2013.01)

(56) References Cited

U.S. PATENT DOCUMENTS

| | | | | |
|---|---|---|---|---|
| 5,036,229 A * | 7/1991 | Tran | H02M 3/073 | 327/531 |
| 5,216,588 A * | 6/1993 | Bajwa | H02M 3/07 | 363/60 |
| 5,301,097 A * | 4/1994 | McDaniel | H02M 3/073 | 363/60 |
| 5,768,115 A * | 6/1998 | Pascucci | H02M 3/07 | 323/284 |
| 5,801,987 A * | 9/1998 | Dinh | G11C 5/145 | 365/185.23 |
| 5,812,017 A * | 9/1998 | Golla | H02M 3/07 | 327/540 |
| 5,982,223 A * | 11/1999 | Park | H02M 3/073 | 363/60 |
| 6,107,864 A * | 8/2000 | Fukushima | H02M 3/073 | 363/60 |
| 6,255,896 B1 * | 7/2001 | Li | H02M 3/073 | 327/536 |
| 6,388,506 B1 * | 5/2002 | Voo | H02M 3/073 | 327/536 |
| 6,501,325 B1 * | 12/2002 | Meng | H02M 3/073 | 327/536 |
| 6,529,050 B1 * | 3/2003 | Kuo | H03K 17/08122 | 327/112 |
| 6,570,435 B1 * | 5/2003 | Hastings | H02M 3/073 | 327/543 |
| 6,664,846 B1 * | 12/2003 | Maung | H02M 3/073 | 363/59 |
| 6,734,717 B2 * | 5/2004 | Min | H02M 3/073 | 363/60 |
| 7,098,725 B2 * | 8/2006 | Lee | H02M 3/073 | 327/536 |
| 7,397,299 B2 * | 7/2008 | Ki | H02M 3/073 | 327/536 |
| 7,443,230 B2 * | 10/2008 | Chen | H02M 3/07 | 327/540 |
| 7,466,190 B2 * | 12/2008 | Lall | H02M 3/07 | 327/536 |
| 7,532,061 B2 * | 5/2009 | Ragone | G11C 5/145 | 327/536 |
| 7,932,770 B2 * | 4/2011 | Yamahira | H02M 3/073 | 363/60 |
| 8,013,666 B1 * | 9/2011 | Liu | H02M 3/07 | 363/60 |
| 8,120,413 B2 * | 2/2012 | Li | H02M 3/073 | 363/60 |
| 8,314,649 B1 * | 11/2012 | Okamoto | H03H 11/245 | 327/541 |
| 8,339,184 B2 * | 12/2012 | Kok | H02M 3/073 | 363/60 |
| 8,461,910 B2 * | 6/2013 | Nadimpalli | H02M 3/073 | 363/60 |
| 8,896,367 B1 * | 11/2014 | Lin | H02M 3/073 | 363/60 |
| 9,026,063 B2 * | 5/2015 | Labaziewicz | H02M 3/07 | 257/107 |
| 9,537,398 B2 * | 1/2017 | Arakawa | G11C 16/30 | |
| 9,847,715 B2 * | 12/2017 | Giuliano | H02M 3/07 | |
| 9,985,016 B2 * | 5/2018 | Choy | H01L 27/1203 | |
| 10,249,346 B2 * | 4/2019 | Michael | G11C 16/12 | |
| 10,998,816 B1 * | 5/2021 | Payak | H02M 3/073 | |
| 2001/0038543 A1 * | 11/2001 | Buck | H02M 3/07 | 363/59 |
| 2002/0130701 A1 * | 9/2002 | Kleveland | H02M 3/073 | 327/536 |
| 2002/0130704 A1 * | 9/2002 | Myono | H02M 3/073 | 327/536 |
| 2003/0107428 A1 * | 6/2003 | Khouri | H02M 3/073 | 327/536 |
| 2003/0174524 A1 * | 9/2003 | Botker | H02M 3/07 | 363/60 |
| 2004/0046603 A1 * | 3/2004 | Bedarida | H02M 3/073 | 327/536 |
| 2004/0095806 A1 * | 5/2004 | Osawa | G11C 5/145 | 365/185.18 |
| 2004/0263238 A1 * | 12/2004 | Thorp | H02M 3/073 | 327/536 |
| 2005/0110560 A1 * | 5/2005 | Kim | H02M 3/07 | 327/536 |
| 2006/0044930 A1 * | 3/2006 | Jung | G11C 11/4094 | 365/210.1 |
| 2008/0036528 A1 * | 2/2008 | Chen | H02M 3/07 | 327/536 |
| 2008/0054991 A1 * | 3/2008 | Maejima | H02M 3/07 | 327/536 |
| 2008/0055991 A1 * | 3/2008 | Kim | G11C 16/3454 | 365/185.11 |
| 2008/0123417 A1 * | 5/2008 | Byeon | G11C 16/30 | 365/230.01 |
| 2008/0136500 A1 * | 6/2008 | Frulio | G11C 5/145 | 327/536 |
| 2008/0174360 A1 * | 7/2008 | Hsu | H02M 3/073 | 327/536 |
| 2008/0205134 A1 * | 8/2008 | Kato | H02M 3/07 | 327/148 |
| 2009/0066408 A1 * | 3/2009 | Fujiwara | H02M 3/07 | 327/536 |
| 2009/0097285 A1 * | 4/2009 | Cook | H02M 3/07 | 363/60 |
| 2009/0167418 A1 * | 7/2009 | Raghavan | H02M 3/073 | 327/536 |
| 2009/0291645 A1 * | 11/2009 | Chu | H04B 1/48 | 455/78 |
| 2010/0007408 A1 * | 1/2010 | Yamahira | G11C 5/143 | 327/541 |
| 2010/0244791 A1 * | 9/2010 | Nirschl | G11C 5/147 | 323/282 |
| 2011/0080198 A1 * | 4/2011 | Ohta | H02M 3/073 | 327/157 |
| 2011/0156802 A1 * | 6/2011 | Nervegna | G11C 17/14 | 327/536 |
| 2011/0156804 A1 * | 6/2011 | Pelgrom | H02M 3/07 | 327/536 |
| 2011/0156805 A1 * | 6/2011 | Kwon | H02M 3/07 | 327/536 |
| 2011/0204961 A1 * | 8/2011 | Galal | H02M 3/07 | 327/536 |
| 2011/0279173 A1 * | 11/2011 | Singnurkar | H02M 3/07 | 327/536 |
| 2012/0063244 A1 * | 3/2012 | Kwon | H02M 3/073 | 365/189.07 |
| 2012/0105137 A1 * | 5/2012 | Kok | H02M 3/073 | 327/536 |
| 2012/0133424 A1 * | 5/2012 | Kern | H02M 3/073 | 327/536 |
| 2012/0140563 A1 * | 6/2012 | Sung | G11C 16/30 | 327/404 |
| 2012/0218032 A1 * | 8/2012 | Nadimpalli | H02M 3/073 | 327/536 |
| 2012/0300552 A1 * | 11/2012 | Neto | H02M 3/073 | 327/536 |
| 2013/0052968 A1 * | 2/2013 | Popplewell | H04B 1/006 | 455/78 |
| 2013/0093503 A1 * | 4/2013 | Kok | H02M 3/07 | 327/536 |

(56) References Cited

U.S. PATENT DOCUMENTS

| | | | | |
|---|---|---|---|---|
| 2013/0252562 A1* | 9/2013 | Hasson | H04B 1/44 | 455/78 |
| 2013/0293284 A1* | 11/2013 | Drost | H02M 3/073 | 327/536 |
| 2013/0300385 A1* | 11/2013 | Li | H02M 3/07 | 323/271 |
| 2014/0011463 A1* | 1/2014 | Madan | H04B 1/48 | 327/434 |
| 2014/0091773 A1* | 4/2014 | Burlingame | H02M 3/073 | 323/271 |
| 2014/0340158 A1* | 11/2014 | Thandri | H03F 3/005 | 330/297 |
| 2015/0054571 A1* | 2/2015 | Watanabe | H02M 3/07 | 327/536 |
| 2015/0061738 A1* | 3/2015 | Kwon | H02M 3/073 | 327/157 |
| 2015/0070080 A1* | 3/2015 | Taft | H02J 1/102 | 327/536 |
| 2015/0070081 A1* | 3/2015 | Taft | H02M 3/073 | 327/536 |
| 2015/0137773 A1* | 5/2015 | Miller | G05F 1/46 | 323/234 |
| 2015/0188599 A1* | 7/2015 | Shi | H04L 1/18 | 455/78 |
| 2015/0288278 A1* | 10/2015 | Shao | G11C 16/16 | 327/536 |
| 2015/0349809 A1* | 12/2015 | Popplewell | H02M 3/07 | 327/536 |
| 2015/0364992 A1* | 12/2015 | Kwon | H02M 3/07 | 327/536 |
| 2016/0181913 A1* | 6/2016 | Feng | H02M 3/07 | 327/536 |
| 2016/0233770 A1* | 8/2016 | Arakawa | H02M 3/158 | |
| 2016/0380532 A1* | 12/2016 | Reddy | G11C 7/22 | 327/536 |
| 2016/0380632 A1* | 12/2016 | Crandall | H02M 3/07 | 327/333 |
| 2019/0081560 A1* | 3/2019 | Mahmoud | H02M 3/07 | |

\* cited by examiner

VOLTAGE GENERATORS WITH CHARGE PUMPS FOR SWITCH CIRCUITS

CROSS-REFERENCE TO RELATED APPLICATIONS

This application is a continuation of U.S. application Ser. No. 15/895,890 filed Feb. 13, 2018 and entitled "CONTROL CIRCUITRY FOR SILICON-ON-INSULATOR CHIP," which claims priority to U.S. Provisional Application No. 62/458,461 filed Feb. 13, 2017 and entitled "CONTROL CIRCUITRY FOR SILICON-ON-INSULATOR CHIP," each of which is expressly incorporated by reference herein in its entirety.

BACKGROUND

Field

The present disclosure generally relates to voltage supply systems in radio-frequency (RF) applications.

Description of Related Art

Many circuits in portable devices such as wireless devices require or utilize DC/DC power conversion to efficiently utilize limited battery supply resources. Often, voltages that exceed a battery voltage are needed or desired, while in other situations voltages that are significantly less than the battery voltage are utilized. A charge pump may be a device, circuit, module, and/or component that may receive an input voltage and may create a higher or lower voltage based on the input voltage. For example, a charge pump may be a DC-to-DC converter that may use capacitors as energy storage elements to convert the input voltage into a higher voltage or a lower voltage.

SUMMARY

According to a number of implementations, the present disclosure relates to a circuit that includes a voltage input port configured to receive an input voltage. The circuit also includes a voltage output port. The circuit also includes an oscillator configured to generate a plurality of clock signals, each clock signal being separated by a non-zero phase difference. The circuit also includes a plurality of charge pump units coupled in parallel to one another, each receiving a voltage received at the voltage input port and providing an output signal that is output at the voltage output port, individual charge pump units configured to receive individual clock signals and to generate respective output signals based on the received clock signals.

In some embodiments, the circuit further includes a control module configured to generate a plurality of control signals, individual charge pump units configured to receive individual control signals and to generate respective output signals based on the received clock signals and the received control signals. In further embodiments, the control module is configured to selectively de-activate charge pump units during operation of the circuit. In further embodiments, the circuit further includes a voltage divider network coupled to the voltage output port, the voltage divider network configured to generate one or more reference voltages indicating a value of the voltage at the voltage output port. In yet further embodiments, the control module is configured to selectively de-activate charge pump units based at least in part on values of the one or more reference voltages. In yet further embodiments, the control module includes a comparator for each reference voltage generated by the voltage divider network, the comparator configured to generate a signal indicating whether a corresponding reference voltage is above or below a reference value. In yet further embodiments, the control module further includes a decision circuit that receives the comparator signals and generates the plurality of control signals based on the comparator signals.

In some embodiments, the circuit further includes a voltage level shifter, the voltage level shifter configured to receive the output voltage provided at the voltage output port and to generate a voltage value having a different value than the output voltage. In further embodiments, the circuit further includes a switch circuit having a series arm that includes a plurality of transistors, the series arm configured to receive the voltage generated by the voltage level shifter. In further embodiments, the switch circuit further includes a shunt arm with a plurality of transistors, the shunt arm configured to receive a voltage generated by a second voltage level shifter. In further embodiments, the circuit further includes a power detector configured to detect a power of a signal through the switch circuit. In further embodiments, the circuit further includes a feedback mechanism configured to adjust the voltage provided by the level shifter based at least in part on the detected power of the signal through the switch circuit.

In some embodiments, a voltage generator includes a plurality of the circuits coupled in series, the voltage generator configured to generate a voltage that has a magnitude that is greater than a magnitude of the input voltage.

According to a number of implementations, the present disclosure relates to a radio-frequency (RF) module that includes a packaging substrate configured to receive a plurality of components. The RF module also includes a switching circuit implemented on the packaging substrate, the switching circuit including a voltage input port configured to receive an input voltage, a voltage output port, an oscillator configured to generate a plurality of clock signals, each clock signal being separated by a non-zero phase difference, and a plurality of charge pump units coupled in parallel to one another, each receiving a voltage received at the voltage input port and providing an output signal that is output at the voltage output port, individual charge pump units configured to receive individual clock signals and to generate respective output signals based on the received clock signals.

In some embodiments, the RF module is a front-end module. In some embodiments, the switching circuit further comprises a voltage level shifter configured to output a positive voltage and a negative voltage. In further embodiments, the switching circuit further includes a series arm configured to receive an RF signal and to output the RF signal in an on state, the series arm configured to receive the positive voltage from the voltage level shifter to put the series arm in the on state and to receive the negative voltage from the voltage level shifter to put the series arm in an off state. In further embodiments, the switching circuit is implemented on a single semiconductor die.

According to a number of implementations, the present disclosure relates to a wireless device a transceiver configured to generate a radio-frequency (RF) signal. The wireless device also includes a front-end module (FEM) in communication with the transceiver, the FEM including a packaging substrate configured to receive a plurality of components, the FEM further including a switching circuit implemented on the packaging substrate, the switching circuit including a voltage input port configured to receive an input voltage, a voltage output port, an oscillator configured to generate a plurality of clock signals, each clock signal being separated by a non-zero phase difference, and a plurality of charge pump units coupled in parallel to one another, each receiving a voltage received at the voltage input port and providing an output signal that is output at the voltage output port, individual charge pump units configured to receive individual clock signals and to generate respective output signals based on the received clock signals. The wireless device also includes an antenna in communication with the FEM, the antenna configured to transmit the amplified RF signal.

In some embodiments, the switching circuit comprises a dual pole dual throw switch configured to swap the RF signal between the antenna and a diversity antenna.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
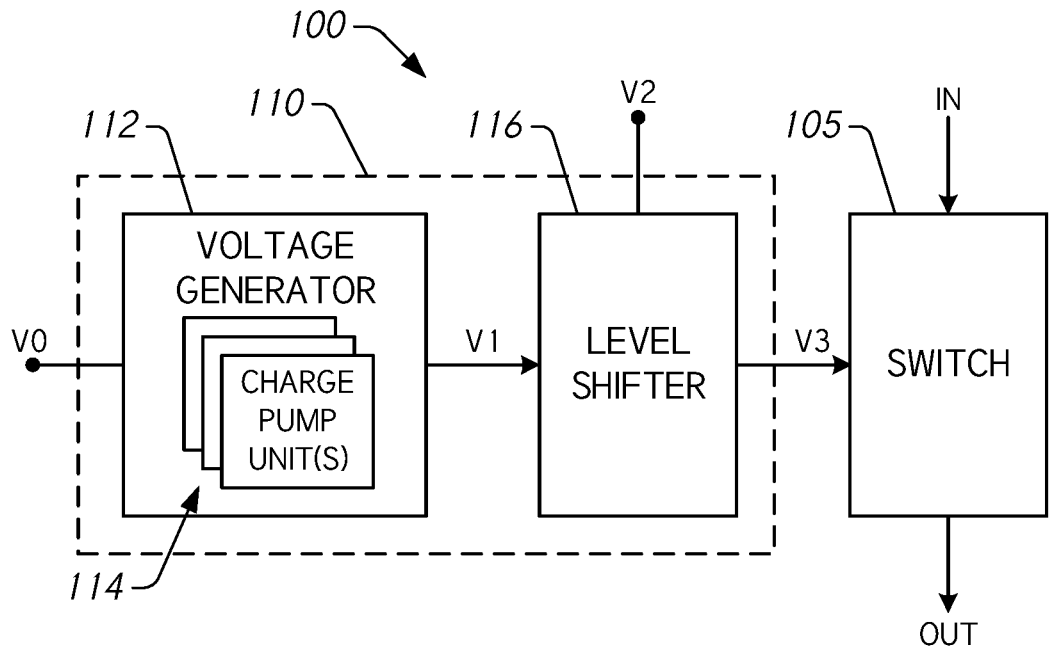
FIG. 1 illustrates a switch configuration having a switch that is controlled by control circuitry.

The headings provided herein, if any, are for convenience only and do not necessarily affect the scope or meaning of the claimed invention.

Overview

Increased use of mobile devices, such as smartphones and tablets, to browse internet content, stream video, and participate in social media motivates a corresponding increase in supporting more cellular bands, higher frequency bands, and lower emissions in uplink and downlink carrier aggregation (CA). One way to increase data throughput is to add more bandwidth through the aggregation of carriers. Carrier aggregation (CA) can be used for both Frequency Division Duplex (FDD) and Time Division Duplex (TDD). As an example, aggregated carriers can have a bandwidth of 1.4, 3, 5, 10, 15 or 20 MHz and five component carriers can be aggregated resulting in a bandwidth of up to 100 MHz. Multiple input, multiple output (MIMO) is another technology that can be used to increase the overall bitrate by transmitting two (or more) different data streams on two (or more) different antennas. Other technologies such as licensed assisted access (LAA), massive CA, and massive MIMO can be employed to further increase network data speeds. However, the potential gain in performance for a MIMO system may be mitigated by the increased cost of the number of radio-frequency (RF) hardware components.

To reduce the complexity of deploying MIMO technology, a complexity reduction technique known as antenna selection/swap can be applied. For example, as described herein, antenna swap may be achieved through a low-cost RF swap switch with a dual pole, dual throw (DPDT) configuration. The DPDT switch generally has higher linearity requirements than typical RF switches. Accordingly, it would be advantageous to provide RF switching architectures that provide targeted performance characteristics, such as targeted linearity, when employed in front end modules that utilize CA, MIMO, and other related technologies.

Moreover, technologies such as MIMO and CA generally require an increase in the number of switches in front end modules (FEMs) in mobile devices compared to other technologies. CMOS Silicon-on-insulator (SOI) technology is an advantageous technology for such switches and antenna tuners in mobile devices. SOI switching circuits utilize DC-to-DC power conversion techniques to efficiently utilize limited battery supply resources. Such circuits may require voltages that differ from a voltage provided by a battery. Accordingly, disclosed herein are SOI switches and associated control circuits having charge pumps. The disclosed charge pumps can dynamically and selectively activate one or more parallel charge pump units to provide targeted power and voltage output.

A charge pump may be a device, circuit, module, and/or component that receives an input voltage (e.g., from a battery) and provides an output voltage that may be different from or more stable than the input voltage. For example, a charge pump may be a DC-to-DC converter that uses capacitors as energy storage elements to create a steady DC voltage (e.g., a higher voltage or a lower voltage). Charge pumps may be used in various electronic devices and/or components. For example, antenna switch modules (ASMs), power management circuits, RF circuits, and the like may use charge pumps. In some instances, a charge pump may also be referred to as a charge pump module.

A charge pump may cause and/or introduce noise into a device, system, and/or circuit when the charge pump is in operation. For example, a charge pump may cause noise in an RF control circuit that uses and/or includes the charge pump. A charge pump may have a larger output impedance for certain voltage outputs, such as when providing a negative voltage. Accordingly, disclosed herein are non-limiting examples of systems, devices, circuits and/or methods related to charge pumps that reduce the introduction of noise into the circuit in which they are implemented and/or lower the output impedance when providing certain voltages (e.g., negative voltage generators). The disclosed embodiments utilize a plurality of smaller charge pumps (or charge pump units) working in parallel that operate on different clock phases rather than using a single charge pump with a relatively large flying capacitor or a plurality of charge pumps in series. This can, for example, reduce spurious signals or spurs that arise due at least in part to the characteristics of the clock signal. The disclosed technologies may be particularly advantageous for SOI-based components and circuits.

Furthermore, disclosed herein are non-limiting examples of systems, devices, circuits, and/or methods related to voltage generators that use a plurality of unity charge pumps in parallel wherein individual charge pump units can be selectively activated and de-activated to provide targeted power requirements (e.g., temporarily increase output power), to selectively reduce current consumption, and/or to increase the rate at which targeted voltage levels can be achieved. In some implementations, the output of the voltage generator can be adjusted based on measured or detected output signals. For example, based on measured or detected output signals, one or more charge pump units can be activated or de-activated to meet the current needs of the system.

In addition, disclosed herein are non-limiting examples of systems, devices, circuits, and/or methods related to cascaded charge pumps to generate higher value negative and/or positive voltages. In some embodiments, individual charge pumps can be cascaded, with each charge pump including a plurality of parallel charge pump units that can be selectively activated and de-activated.

Moreover, disclosed herein are non-limiting examples of systems, devices, circuits, and/or methods related to reducing Ron in SOI switches to improve harmonics. For example, Ron can be reduced in these switches by increasing the positive voltage for the ON switch when a high signal at the switch is measured or detected.

Other techniques to increase the capability of charge pumps may be based on higher clock frequency, but this may increase current consumption and the noise generated in system (e.g., switches and FEMs). Also, other techniques may be based on a single charge pump with a bigger flying capacitor. In contrast, the technologies disclosed herein provide a voltage generator or charge pump with a plurality of charge pump units working in parallel on different clock phases. All of the generated clock phases can be reused when operating the charge pump and one or more of the plurality of charge pump units can be selectively activated to provide targeted power and/or speed. This can provide a number of advantages including reducing noise arising from charge pump activity and/or increasing the strength (e.g., lowering the output impedance) of a voltage generator.

The disclosed charge pumps can be implemented in switching applications. For example, often there are integrated charge pumps in an antenna switch module of a wireless device, which are used to boost the battery voltage to control the field effect transistors (FETs) comprising the switches. An oscillator may be used to drive the charge pump (e.g., may open/close switches in the charge pump which may cause one or more capacitors of the charge pump to charge/discharge). In some embodiments, the clock signal generated by the oscillator may be used to generate signals with different phases, with individual clock signals being directed to individual charge pump units in a charge pump. Furthermore, control signals can be used to selectively activate one or more charge pump units to dynamically adjust output power, current, and/or voltage of the charge pump. Advantageously, this can be used to increase the speed with which the voltage generator or level shifter changes voltage levels (e.g., changing from a negative voltage, or "OFF" switch state, to a positive voltage, or "ON" switch state). Similarly, this can be used to decrease power consumption as the voltage generator and/or level shifter approach the targeted voltage to be provided to the switch. Although the present disclosure may be described in the context of charge pumps, it will be understood that one or more features of the present disclosure may also be utilized in other voltage generators and applications.

Examples of Switches, Control Circuits, and Charge Pumps

FIG. 1 illustrates a switch configuration 100 having a switch 105 that is controlled by control circuitry 110. The control circuitry 110 can be directly connected to a voltage source (not shown), such as a battery, and is configured to provide a positive and negative voltage, V3, to selectively turn the switch 105 on and off. The switch 105 includes an input port that is configured to receive an input signal, such as a radio frequency (RF) signal, and an output port configured to provide an output signal when the switch is in the ON state. Example switches are described herein in greater detail with reference to FIGS. 9-11.

The control circuitry 110 includes a voltage generator 112 having a plurality of charge pump units 114, the voltage generator 112 configured to receive an input voltage, V0, such as a battery voltage, and to produce an output voltage, V1. The plurality of charge pump units 114 can be individually and selectively activated and de-activated to provide a desired or targeted output signal, V1.

The control circuitry 110 includes a level shifter 116 that has as inputs a voltage V2 and the voltage V1 from the voltage generator 112. The level shifter 116 can be configured to output different voltage values (e.g., V3) to the switch 105. For example, to turn the switch off, the level shifter 116 can output a negative voltage. To turn the switch on, the level shifter 116 can output a positive voltage. In some embodiments, the level shifter 116 is configured to provide a range of output voltages and can vary the output voltage based on feedback from the switch configuration. An example level shifter is described herein in greater detail with reference to FIG. 8.

The charge pump units 114 in the voltage generator 112 are in a parallel configuration rather than in a series configuration. The parallel configuration allows individual charge pump units to be selectively activated and de-activated to provide a targeted output voltage. This parallel charge pump unit configuration differs from voltage generators with charge pump units in series wherein each charge pump unit in the series is configured to increase the magnitude of the output voltage of the voltage generator. In contrast, selectively activating charge pump units 114 in the parallel configuration allows the voltage generator 112 to dynamically adjust the properties of the output signal, V1. This includes, for example, adjusting the output power of the voltage generator 112. As another example, when changing the switch from an "OFF" state to an "ON" state, all or substantially all of the charge pump units 114 can be activated to decrease the time it takes to achieve the targeted "ON" voltage provided by the level shifter 116. As the voltage V3 approaches a targeted "ON" voltage, individual charge pump units 114 can be de-activated. This configuration can be advantageous due at least in part to the control circuit 110 consuming less power over time while still providing relatively fast voltage changes to the switch 105. As described herein, multiple voltage generators or multiple parallel stacks of charge pump units can be cascaded to generate higher or lower voltage values.

Figure 2:
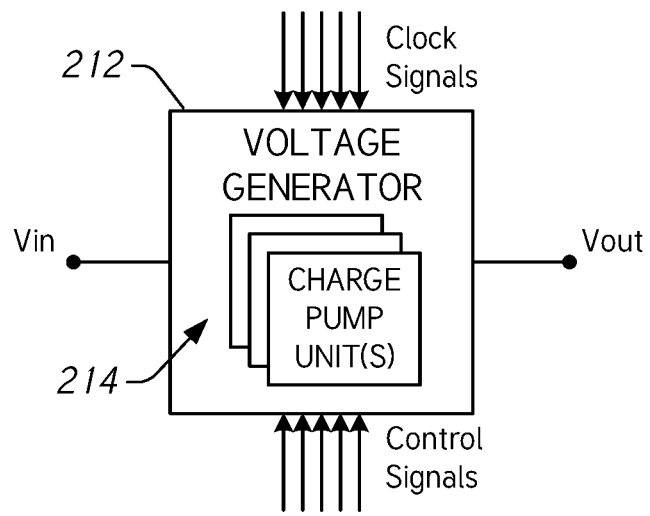
FIG. 2 illustrates an example voltage generator having a plurality of charge pump units configured to receive an input voltage and to generate an output voltage.

FIG. 2 illustrates an example voltage generator 212 having a plurality of charge pump units 214 configured to receive an input voltage, Vin, and to generate an output voltage, Vout. The voltage generator 212 receives a plurality of clock signals, individual clock signals being directed to individual charge pump units. The clock signals can be generated by a single clock, such as a multi-stage ring oscillator. Signals from the clock can be offset in phase and provided to the voltage generator 212.

The voltage generator 212 can operate the charge pump units 214 on individual clock signals. In some embodiments, the clock signals for different charge pump units 214 have the same frequency and different phases. By operating charge pump units 214 on different phases of a clock signal, noise introduced in the system by the voltage generator 212, e.g., spurious signals or spurs, can be reduced.

The voltage generator 212 also receives a plurality of control signals that are configured to selectively activate or de-activate individual charge pump units 214 to dynamically adjust properties of the output signal, Vout. The control signals can be provided by a control module, a controller, a detector, a feedback circuit, or the like. As described herein, the control signals can be based at least in part on the output signal, Vout, of the voltage generator 212.

Figure 3:
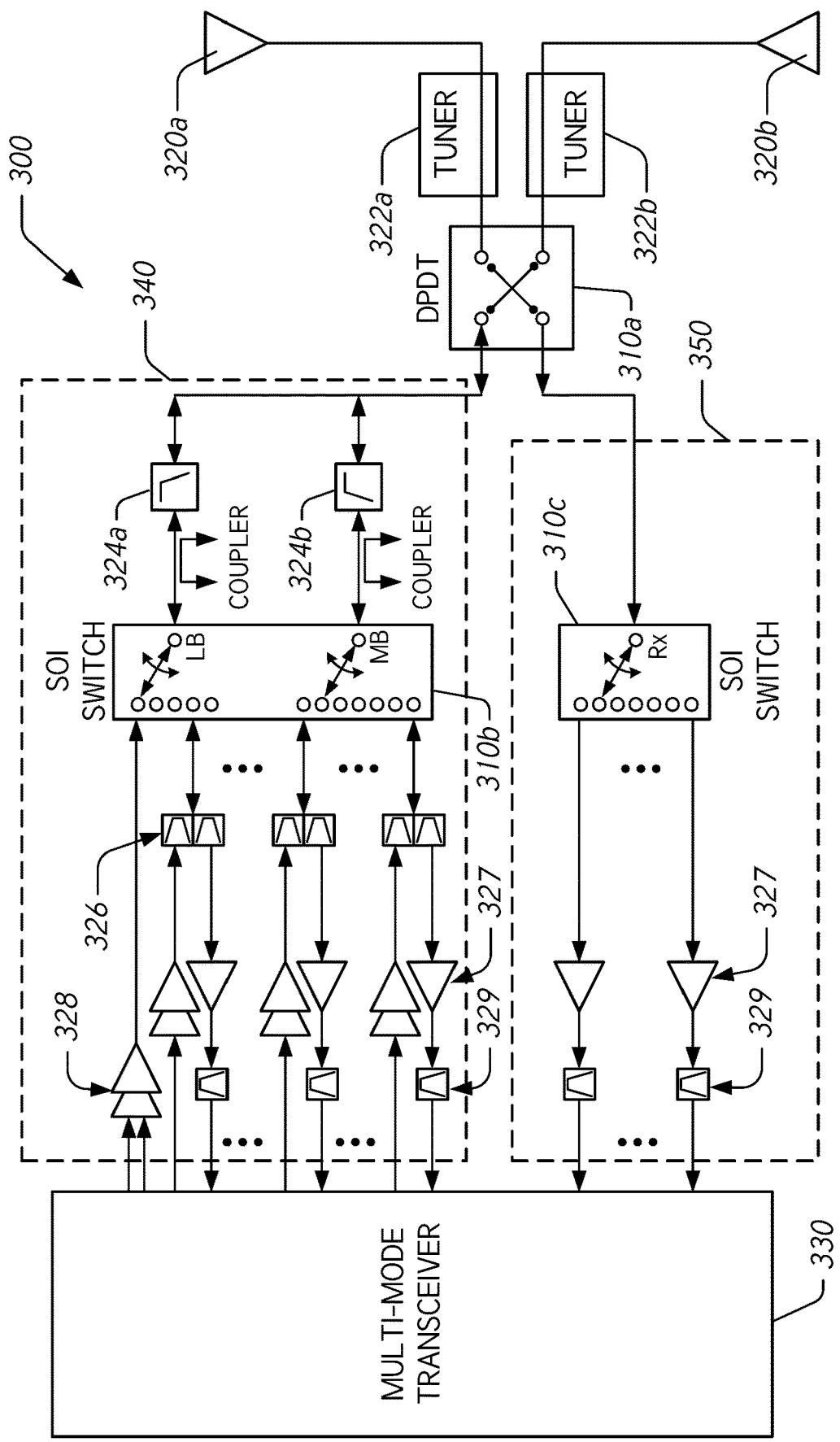
FIG. 3 illustrates a schematic diagram showing some radio front-end components of a wireless device having RF switches with control circuitry that includes voltage generators with parallel charge pump units that can be selectively activated.

As described herein, the RF (radio frequency) switch is one of the many components that facilitate operation of a wireless device on multiple frequency bands. To that end, RF switches in various forms are often utilized throughout the radio front-end of a wireless device. By way of example, FIG. 3 illustrates a schematic diagram showing some radio front-end components of a wireless device 300 with RF switches 310a, 310b, 310c, wherein one or more of the RF switches 310a, 310b, 310c includes control circuitry having one or more voltage generators comprising parallel charge pump units that can be selectively activated, as described in greater detail herein. Those skilled in the art will appreciate that a wireless device may include fewer, more and/or different components than are illustrated in FIG. 3, and that FIG. 3 merely includes some example components to facilitate the discussion of aspects of example implementations disclosed herein.

The portion of the device 300 illustrated in FIG. 3 includes a multi-mode transceiver 330, a front-end module (FEM) 340, and a diversity receive FEM 350. In a wireless system, a front-end module (FEM) acts as an interface between the antenna and RF transceiver. In addition, the device 300 includes SOI switches with integrated SOI control circuitry (examples of which are described herein): antenna swap switch 310a, FEM switch 310b, and diversity FEM switch 310c. The device also includes antennas 320a and 320b, tuners 322a and 322b, diplexers 324a and 324b, duplexers 326, amplifiers 327 and 328, and filters 329.

The multi-mode transceiver 330 is coupled to the FEM 340 and the diversity FEM 350. For the sake of simplifying the description herein, the multi-mode transceiver 330 includes what those skilled in the art would consider the radio back-end or baseband and intermediate frequency (IF) components. Baseband and IF components typically implement functions such as, but not limited to, voice-to-data encoding, packet forming and framing of data, forward error correction, pulse shaping, etc. Those skilled in the art will appreciate from the present description that various baseband and IF functions are often implemented in various wireless devices, and that a more detailed description of those functions has been omitted for the sake of brevity.

The antenna swap switch 310a selectively couples the antennas 320a, 320b to the FEM 340 and/or the diversity FEM 350. The antenna swap switch 310a is a dual pole dual throw (DPDT) switch. The antenna swap switch 310a can be a high-linearity swap switch with control circuitry that contributes to improved performance, as described herein. For example, the control circuitry can include voltage generators with parallel charge pump units that can be independently activated. The antenna swap switch 310a can be part of a complexity reduction technique for MIMO systems, for example. This can reduce the number of relatively expensive RF hardware components typically used when deploying MIMO technology in a wireless device. The antenna swap switch 310a selectively couples RF signals between the FEM 340 and either of the antennas 320a, 320b. Similarly, the antenna swap switch 310a selectively couples RF signals between the diversity FEM 350 and either of the antennas 320a, 320b.

The FEM 340 and diversity FEM 350 are multi-band FEMs. To that end, for example and without limitation, the FEM 340 and/or diversity FEM 350 can include modules for EDGE/EGPRS (Enhanced Data Rate GSM Evolution/Enhanced General Packet Radio Service), CDMA (e.g., 1×RTT, Evolution-Data Optimized CDMA (EV-DO)), UMTS-TDD (Universal Mobile Telecommunications System-Time Division Duplex), LTE-Advanced, and the like. The corresponding amplifiers 327 provide respective receiver-side amplifiers (e.g., low-noise amplifiers or LNAs). The corresponding amplifiers 328 provide respective transmitter-side amplifiers (e.g., power amplifiers or PAs).

The device 300 is designed for operation on multiple frequency bands. This can be used in CA configurations and MIMO configurations, for example and without limitation. The device 300 includes diplexers 324a, 324b respectively configured to direct low-band (LB) signals and mid-band (MB) signals to the FEM switch 310b. Transmit signals can be routed from the multi-mode transceiver 330 through amplifiers 328 to duplexers 326 and through switches 310b and 310a to a particular antenna 320a, 320b. Similarly, receive signals can be routed from a particular antenna 320a, 320b through switches 310a, 310b and duplexers 326 to amplifiers 327 and filters 329 to the multi-mode transceiver 330.

In some embodiments, signals received at the antennas 320a, 320b can be directed along a diversity receive path through the diversity FEM 350 having the diversity FEM switch 310c to the multi-mode transceiver 330. The diversity FEM 350 includes parallel amplifiers 327 (e.g., LNAs) that can be configured to provide multiple-output spatial diversity processing by the wireless device 300. Diversity techniques can be used to increase data rates and resilience against adverse channel conditions. For complexity, cost, and power considerations, diversity techniques can be applied exclusively on the receiver side of a mobile wireless device. In some embodiments, the power-handling requirements for the diversity FEM switch 310c can be less than the requirements for the FEM switch 310b due at least in part to spatial diversity techniques not being used when received signals have relatively high RF power.

While the aforementioned configurations of RF switches are illustrated in FIG. 3, those skilled in the art will appreciate that there are numerous configurations for RF switches that may be employed within a wireless device. For example, RF switch configurations in smart phones range from relatively simple, single-pole, single-throw (SPST) or single-pole, double-throw (SPDT) configurations through to more complex single-pole, n-throw (SPNT) configurations, double-pole, single-throw configurations (DPST), m-pole, single-throw configurations (MPST), double-pole, double-throw configurations (DPDT), and can sometimes include m-pole, n-throw configurations (MPNT).

As described in greater detail herein, each of the switches 310a, 310b, 310c can include integrated control circuitry. Multi-port antenna switches can be important building blocks in RF front-ends for cellular applications. With increased band utilization and standard implementation in wireless devices, both the complexity of control schemes and targeted multi-port antenna switch performances increase. Typically, GaAs pHEMT has been a dominant technology for RF antenna switch implementation. However, GaAs pHEMT antenna switches generally require a separate CMOS controller die for a logic and a charge pump circuit because a relatively high voltage is needed to control GaAs pHEMT switches. Accordingly, the disclosed voltage generators and control circuitry can be integrated on SOI CMOS switches to improve RF switch performance. Such implementations of SOI switches can provide desirable RF switch performance with integrated controllers, leading to a relatively compact low-cost, low-power switch with high linearity.

As described in further detail herein, the switches 310a, 310b, and/or 310c can include integrated controllers that are configured to enable targeted RF isolation between the throws of the switch, targeted linearity, and/or targeted reduction of noise. For example, integrated charge pumps in the antenna switch controller can be used to adjust the battery voltage to control the field-effect transistors (FETs) included in the switch. The multiple charge-pumps can improve switch insertion loss and isolation, enhance the robustness of the compression point, and/or improve linearity.

Figure 4:
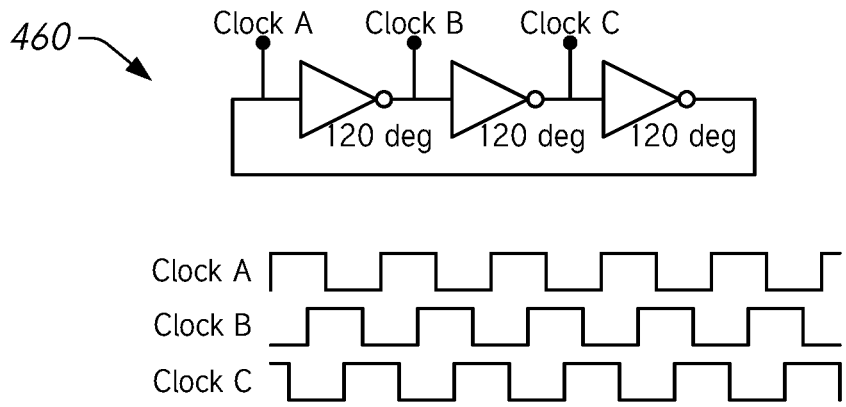
FIG. 4 illustrates an example charge pump that includes a plurality of parallel charge pump units.
Figure 4:
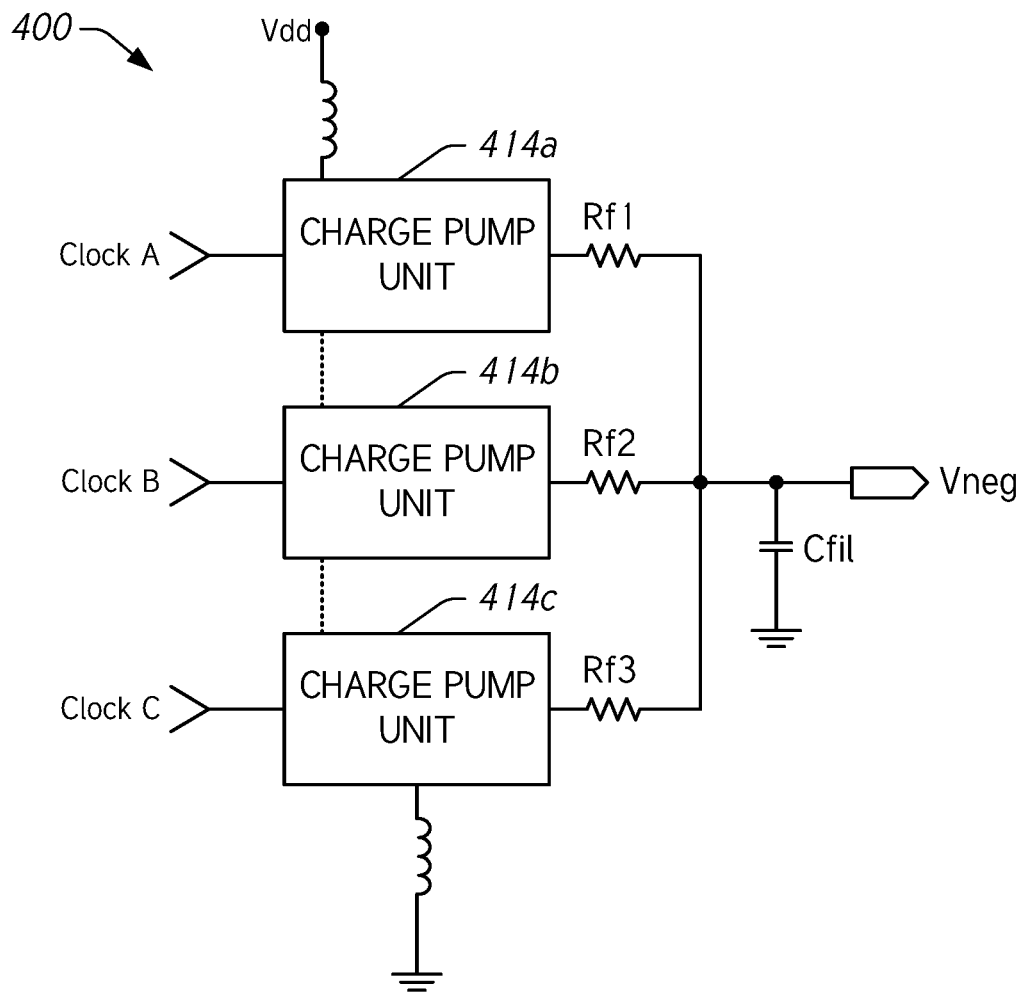

FIG. 4 illustrates an example charge pump 400 that includes a plurality of parallel charge pump units 414a-414c. The charge pump 400 is configured to receive a voltage, Vdd, (such as from a battery, an LDO, or other voltage source), and to generate an output voltage, Vneg. Although three parallel charge pump units 414a-414c are illustrated, it is to be understood that any suitable number of parallel charge pump units may be used. For example, the charge pump 400 can include at least 2 parallel charge pump units, at least 3 parallel charge pump units, at least 4 parallel charge pump units, at least 5 parallel charge pump units, and so on.

Each charge pump unit 414a-414c is coupled in series with a respective output resistor, Rf1-Rf3. In some embodiments, the output resistors have the same value of resistance. The charge pump units 414a-414c and output resistors are coupled in parallel to an output node with a filtering capacitor, Cfil, coupled between the output node and a reference potential node. In some embodiments, the charge pump units 414a-414c are identical or substantially identical to one another so that there is no significant difference between them.

The charge pump 400 receives clock signals for each charge pump unit 414a-414c. The clock signals are generated using a three-stage ring oscillator 460. The clock signals are offset in phase from one another to reduce spurs introduced by the charge pump 400. For example, for three charge pump units, the clock signals can be offset in phase 120 degrees from one another.

The charge pump units 414a-414c operate on the edge of the clock signal. For example, when an edge is present in the clock signal, the corresponding charge pump unit 414a-414c takes energy from a power supply to provide an output signal. Due at least in part to the charge pump units 414a-414c operating on different phases of the clock signal (or clock signals that are offset in phase), the voltage generated by the charge pump 400 can have reduced spurious signals, or spurs, relative to a charge pump with a single charge pump unit or multiple charge pump units that operate on the same clock signal (or phase-aligned clock signals). For example, conventional control of an RF switch can produce undesirable spurs (e.g., spurious tones) in the output signal of an RF switch. The clock signal may contribute clock feed-through spurs at a controller output, and eventually a switch output coupled to an antenna. Accordingly, disclosed herein are implementations of switch controllers that include a poly-phase (e.g., a "multi-phase") clocking scheme, as opposed to a single-phase scheme, to clock the parallel charge pump units of a charge pump or voltage generator. In some implementations, poly-phase clocking schemes reduce the clock signal induced spurs and may preclude the need for additional off-chip decoupling capacitors that add to cost and module substrate area for a complete FEM solution.

Reduction of clock feed-through spurs may occur due at least in part to the individual charge pump units 414a-414c drawing current from a regulated supply (e.g., the supply of voltage Vdd) at different points in time due to the different clock phases received by the charge pump units. Thus, the momentary droop on the supply that results increases in frequency with additional charge pump units, which has the net effect of pushing out the dominant spur. In addition, by clocking each of the charge pump units 414a-414c of the charge pump 400 at different phases, and therefore different instances in time, the amplitude of the dip imposed on the regulated supply, and thus a battery feeding the supply, may be smaller because only one unit is drawing current while being switched on at a time. Consequently, the amplitude of the fundamental spur itself may be reduced by as much as a factor of two or more depending on the number of clock phases provided to the charge pump unit 400. Further description of this reduction in spurious signals is provided in U.S. Pat. No. 9,083,455, issued Jul. 14, 2015 and entitled "Reduced clock feed-through systems, methods, and apparatus," which is incorporated by reference herein in its entirety for all purposes.

Figure 5:
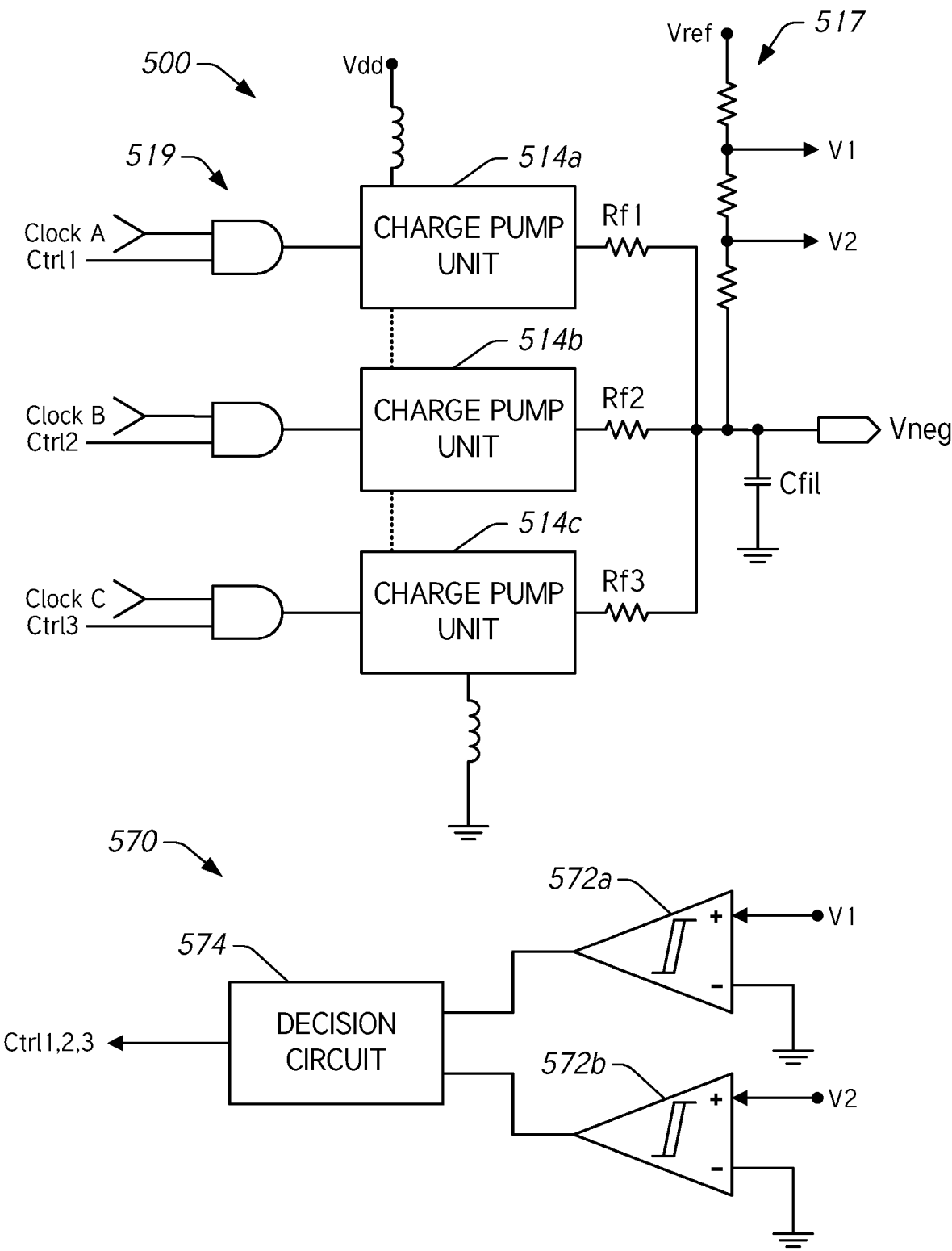
FIG. 5 illustrates an example charge pump that includes a plurality of parallel charge pump units that can be individually activated and de-activated.

FIG. 5 illustrates an example charge pump 500 that includes a plurality of parallel charge pump units 514a-514c that can be individually activated and de-activated. As with the charge pump 400 described herein with reference to FIG. 4, the charge pump 500 includes a plurality of parallel charge pump units 514a-514c and can receive a corresponding plurality of clock signals with different phases. Moreover, individual charge pump units 514a-514c can be activated and de-activated based on an output voltage, Vneg, of the charge pump 500. Accordingly, the charge pump 500 can scale the amount of power consumed by selectively turning off charge pump units. For example, when turning on, all charge pump units can be activated and as the output voltage approaches a targeted voltage, individual charge pump units can be de-activated. In some embodiments, when the charge pump 500 provides a targeted voltage or a voltage within a targeted range, all but one of the charge pump units 514a-514c can be de-activated. In various embodiments, a fraction or portion of the charge pump units 514a-514c (e.g., one or more but less than all of the charge pump units) can be activated when the charge pump 500 is providing a substantially steady state output voltage.

The charge pump 500 includes a voltage divider network 517 configured to provide output voltages V1 and V2 for the purpose of activating and de-activating the charge pump units 514a-514c. The voltage divider network 517 can receive a reference voltage (e.g., a positive voltage, Vref) and output a voltage V1 after a first resistor and a second voltage V2 after a second resistor. The voltage divider network 517 can be coupled to the output node of the charge pump 500 so that the voltages V1 and V2 scale with changes in the output voltage, Vneg. For example, when the charge pump 500 is off (e.g., no charge pump units are activated), the voltages V1 and V2 represent voltage drops between Vref and 0 V (e.g., Vneg is 0 when no charge pump units are active). When the charge pump 500 is turned on, the voltages V1 and V2 change over time as Vneg changes from 0 V to a targeted output voltage. The resistors in the voltage divider network 517 can be selected so that as Vneg changes from 0 V to the targeted output voltage, V2 and V1 change from being positive voltages to being negative voltages at desired or targeted times or points in the charging process.

The charge pump 500 or another system in communication with the charge pump 500 includes a control module 570 that generates control signals corresponding to individual charge pump units 514a-514c. The control module includes comparators 572a, 572b and a decision circuit 574. The comparators 572a, 572b can be configured to output a voltage value (e.g., a logic true or false) based on a comparison of a voltage to ground or another reference voltage. The decision circuit 574 can be configured to receive the voltage values from the comparators 572a, 572b and to generate control signals for each of the plurality of charge pump units 514a-514c in the charge pump 500. In some embodiments, the comparators 572a, 572b can be comparators with hysteresis (e.g., similar to Schmitt triggers) to avoid fluctuating output signals when the input signal is at or near the comparison value.

The output of the decision circuit 574 and/or the control module 570 can be control signals (e.g., Ctrl1, Ctrl2, and Ctrl3) that are directed to AND gates 519 that also receive respective clock signals (e.g., Clock A, Clock B, and Clock C). Thus, for an individual charge pump unit 514a-514c, when the corresponding control signal is true (e.g., a signal indicating the unit should be active) the clock signal passes to the corresponding charge pump unit and the unit operates as normal (e.g., as described herein with reference to FIG. 4) and when the corresponding control signal is false (e.g., a signal indicating the unit should not be active) the corresponding charge pump unit does not receive a clock signal and consequently does not contribute to the output of the charge pump unit 500.

The control signals are generated by the decision circuit 574 based on the voltages V1 and V2 generated at the voltage divider network 517. As illustrated, when V2 goes from positive to negative (e.g., crosses 0 V), the comparator 572b changes its signal from true to false (or from false to true). Similarly, when V1 goes from positive to negative (e.g., crosses 0 V), the comparator 572a changes its signal from true to false (or from false to true). The decision circuit 574 receives the signals from the comparators 572a, 572b and generates the control signals based at least in part on logic within the decision circuit 574. For example, when the comparators 572a, 572b indicate that the voltages V1 and V2 are positive, the decision circuit 574 can generate control signals that activate all of the charge pump units 514a-514c. As the voltages V1 and V2 pass from being positive to negative, the decision circuit 574 can generate control signals that de-activate certain of the charge pump units 514a-514c. This can be done to consume less power as the charge pump 500 approaches the targeted output voltage. In some embodiments, the control module 570 is configured to de-activate all of the charge pump units 514a-514c when the charge pump 500 is off regardless of the values of the voltages V1 and V2.

By way of example, the time that the charge pump 500 is turned on can be defined as t0 (e.g., t=0), and at t0 the voltages V1 and V2 are greater than 0 V. At a later time, t1>0, the voltage V2 is 0 V and the voltage V1 is greater than 0 V. At a later time, t2>t1, the voltage V1 is 0 V and the voltage V2 is less than 0 V. At a later time, t3>t2, the voltages V1 and V2 are less than 0 V. Between times t0 and t1, the decision circuit 574 generates control commands enabling all charge pump units 514a-514c in the charge pump 500. Between times t1 and t2, the decision circuit 574 generates control commands enabling charge pump units 514a and 514b and disabling charge pump unit 514c. After time t2, the decision circuit 574 generates control commands enabling charge pump unit 514a and disabling charge pump units 514b and 514c.

It is to be understood that the example illustrated in FIG. 5 is merely illustrative and not limiting. For example, different numbers of charge pump units can be employed in the charge pump 500. Similarly, more or fewer voltage references can be generated by the voltage divider network 517 (with corresponding comparators in the control module 570). For example, by increasing the number of voltage references generated by the voltage divider network 517, the control module 570 can have finer-grained control of the charge pump 500. Moreover, the control commands generated by the control module 570 can be configured to control a plurality of charge pump units (e.g., groups of charge pump units can be activated or de-activated together). For example, a single control signal can be sent to the AND gates of two or more charge pump units (still having clock signals that are offset in phase). Furthermore, each control signal can be used to control different numbers of charge pump units. For example, a first control signal can control one charge pump unit, a second control signal can control two charge pump units, a third control signal can control four charge pump units, a fourth control signal can control a single charge pump unit, and the like. In addition, the comparators can be configured to compare the reference voltages from the voltage divider network 517 to different values other than 0 V or a reference potential node. In some embodiments, the disclosed charge pump unit 500 can be configured to generate positive voltages with appropriate changes made to the reference voltage, Vref, and the comparators 572a, 572b.

Figure 6:
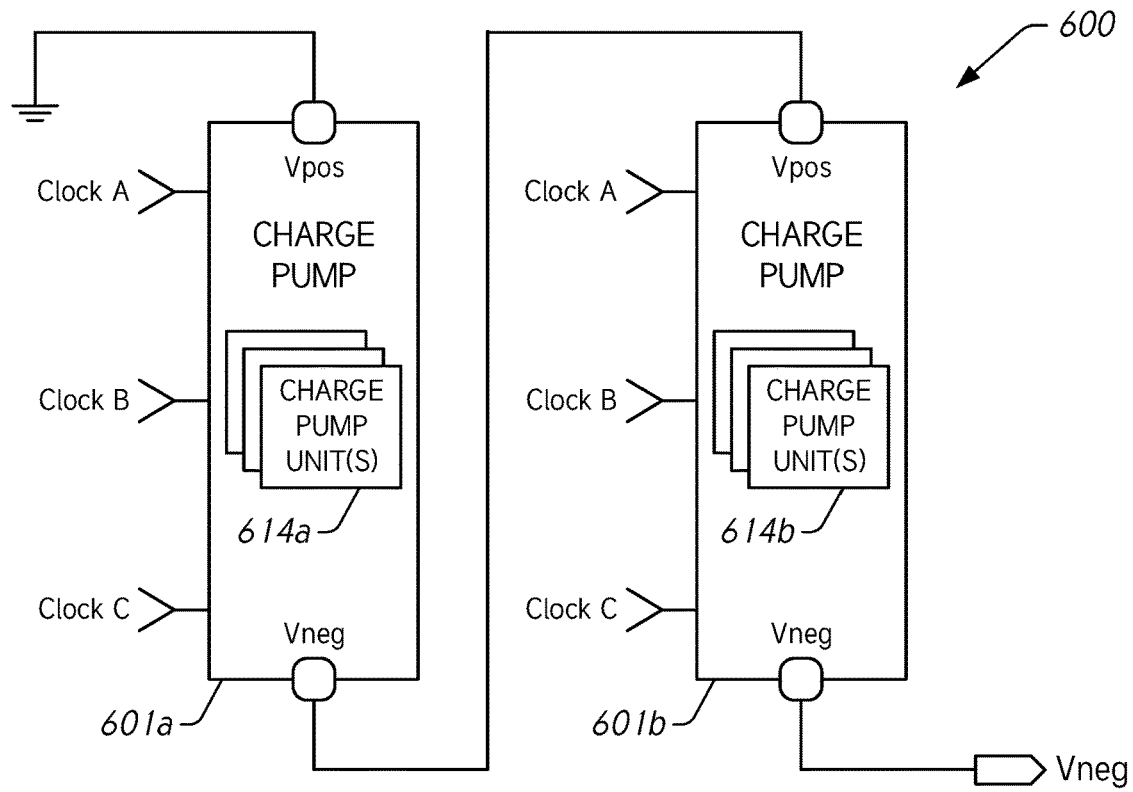
FIG. 6 illustrates an example voltage generator that stacks charge pumps to generate larger negative voltages.
Figure 7:
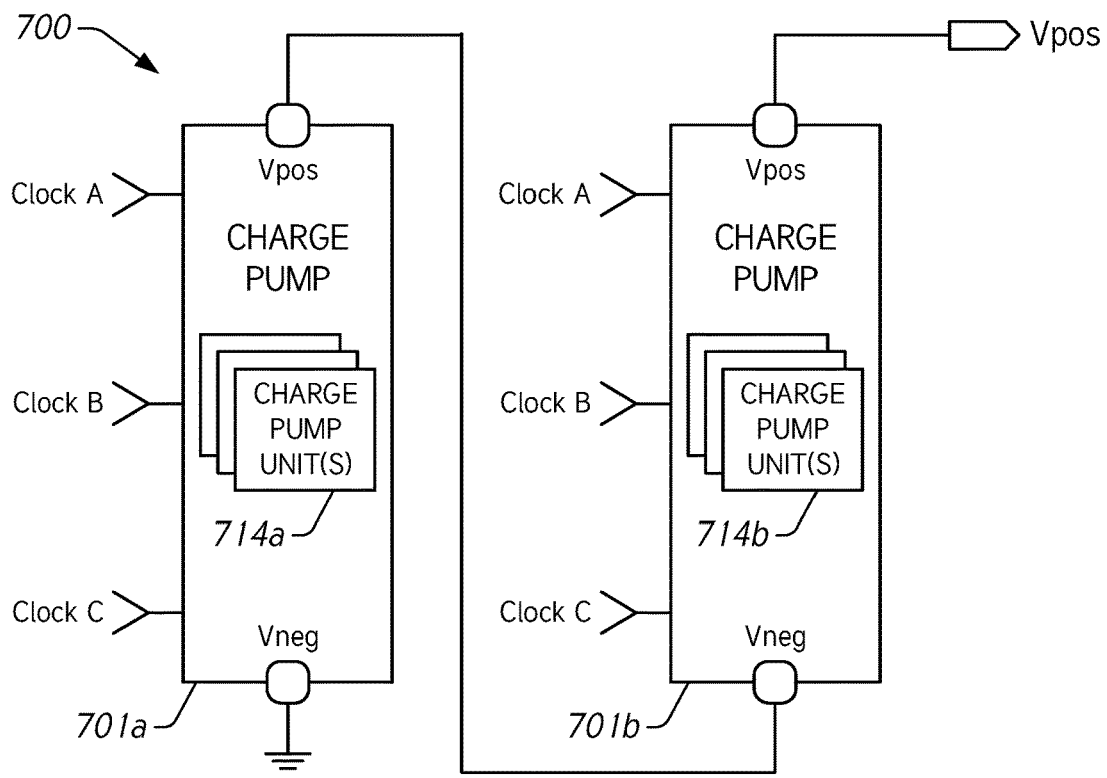
FIG. 7 illustrates an example voltage generator that stacks charge pumps to generate larger positive voltages.

FIGS. 6 and 7 illustrate examples of voltage generators that stack charge pumps to generate larger negative or positive voltages. For both positive and negative voltage generation there is the possibility to cascade two or more charge pumps and to get a higher voltage. This may be useful when the battery voltage or supply voltage is relatively low and/or it is desirable to overdrive a switch to improve performance (e.g., to have a better on resistance or Ron).

FIG. 6 illustrates an example negative voltage generator 600 having two charge pump units 601a, 601b coupled together to produce a negative voltage. For example, the positive voltage terminal of the charge pump unit 601a is coupled to a reference potential node and the negative voltage terminal of the charge pump unit 601a is coupled to a positive voltage terminal of the charge pump unit 601b, and the negative terminal of the charge pump unit 601b provides the output negative voltage, Vneg. Each charge pump 601a, 601b can include respective pluralities of parallel charge pumps 614a, 614b that operate on clock signals that differ in phase from one another (examples of which are described herein with reference to FIG. 4). In some embodiments, individual units of the pluralities of charge pump units 614a, 614b can be selectively activated and/or de-activated (examples of which are described herein with reference to FIG. 5).

FIG. 7 illustrates an example positive voltage generator 700 having two charge pump units 701a, 701b coupled together to produce a positive voltage. For example, the negative voltage terminal of the charge pump unit 701a is coupled to a reference potential node and the positive voltage terminal of the charge pump unit 701a is coupled to a negative voltage terminal of the charge pump unit 701b, and the positive terminal of the charge pump unit 701b provides the output positive voltage, Vpos. Each charge pump 701a, 701b can include respective pluralities of parallel charge pumps 714a, 714b that operate on clock signals that differ in phase from one another (examples of which are described herein with reference to FIG. 4). In some embodiments, individual units of the pluralities of charge pump units 714a, 714b can be selectively activated and/or de-activated (examples of which are described herein with reference to FIG. 5).

A limitation for such implementations may be the overall increase in the size of the layout for corresponding switch control circuitry. However, a benefit of using a lower internal voltage, Vdd, and generating higher voltages from that is reverse power supply rejection which helps with the spur reduction into the power supply pins. As described herein, using different phases of a clock signal for the charge pump units reduces the spurs and can decrease the turn-on time for RF switches. This may be particularly useful when the switch is a DPDT (e.g., switch 310a described herein with reference to FIG. 3) used in an asymmetrical CA uplink/downlink and the wireless device is used simultaneously for GSM voice and LTE data with one or two operators.

Figure 8:
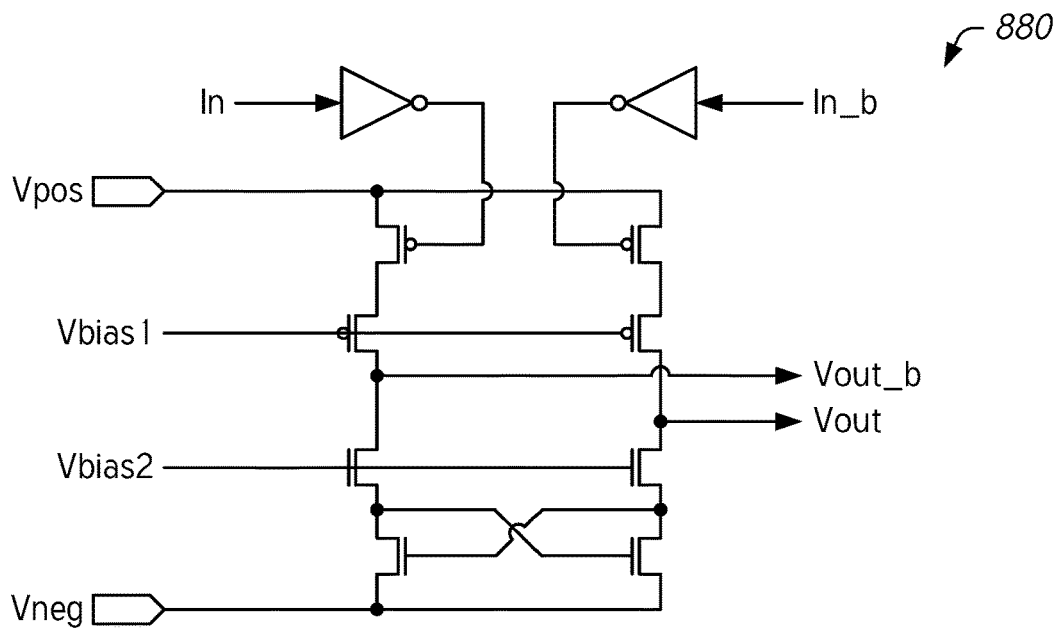
FIG. 8 illustrates an example voltage level shifter configured to receive a negative voltage from a negative voltage generator and to generate different output voltage values.

FIG. 8 illustrates an example voltage level shifter 880 configured to receive a negative voltage, Vneg, from a charge pump or negative voltage generator and to generate different output voltage values at Vout and Vout_b. The voltage level shifter 880, along with a voltage generator or charge pump, can be part of control circuitry for a switch. The voltage level shifter 880 also receives a positive voltage, Vpos, from a voltage or power supply, such as a battery. The voltage level shifter 880 includes biasing networks to provide suitable bias voltages Vbias1, Vbias2 to gates of pMOSFET transistors (for Vbias1) and to gates of nMOS-FET transistors (for Vbias2) of the voltage level shifter 880. The voltage level shifter 880 receives input signals, In and In_b, to control the output signals, Vout and Vout_b. The input signals are passed through a not gate to invert the signals which are sent to gates of pMOSFET transistors to control the output signals to generate voltages between Vpos and Vneg. In some embodiments, the voltage level shifter 880 can be configured to generate a number of different voltage levels between Vpos and Vneg. In some embodiments, the voltage level shifter 880 can be configured to generate a number of different positive and negative voltage levels.

In some embodiments, the voltage level shifter 880 can be configured to receive the negative voltage Vneg from a charge pump as described herein with reference to FIG. 4 or 5. In certain embodiments, the voltage level shifter 880 can be configured to receive the negative voltage Vneg from a negative voltage generator as described herein with reference to FIG. 6. Similarly, in some embodiments, the voltage level shifter 880 can be configured to receive the positive voltage Vpos from a charge pump as described herein with reference to FIG. 4 or 5. In certain embodiments, the voltage level shifter 880 can be configured to receive the positive voltage Vpos from a positive voltage generator as described herein with reference to FIG. 7.

Figure 9:
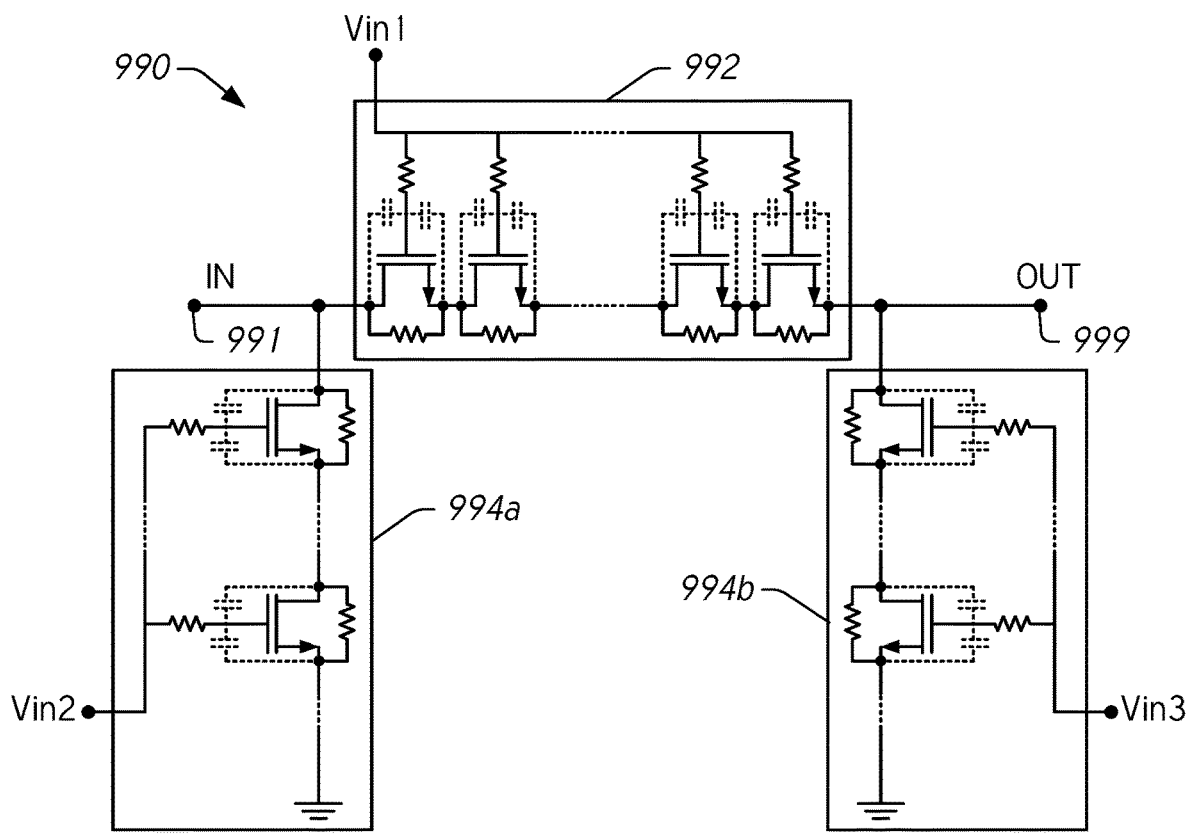
FIG. 9 illustrates a switch for RF applications.

FIG. 9 illustrates a switch 990 for RF applications. The switch 990 is configured to receive an input signal (e.g., an RF signal) at an input port 991 and to provide the RF signal at an output port 999 when the switch is in an ON state. The switch 990 includes a series arm 992 and shunts 994a, 994b. A typical antenna switch may experience a swing of up to about 30 V due to a combination of high power and mismatch at the antenna. To withstand such high voltages, the switch 990 includes multiple stacked FETs to form a 'switch arm.' The switch 990 is in a series-shunt configuration wherein the series arm 992 provides a low-resistance path for the signal between the input port 991 and the output port 999 in the ON state, and the shunt arms 994a, 994b provide a low-resistance path for the signal power to ground to reduce or prevent current that may leak to the output port 999 in the OFF state.

The series FETs in the switch 990 can be configured to handle relatively high RF power when the switch is in the OFF state and to provide relatively low insertion loss when the switch is in the ON state. In the OFF state, the input port 991 is grounded with a shunt arm 994a to provide isolation. The switch 990 ON/OFF states are controlled through a positive voltage and a negative voltage applied on the FET gates. In the OFF state the stacked transistors provide a voltage divider that effectively limits the voltage Vgs and Vgd across each transistor.

The series arm 992 is controlled by the voltage Vin1 while the shunt arms 994a, 994b are respectively controlled by voltages Vin2 and Vin3. Each of the control voltages Vin1, Vin2, and Vin3 can be provided by a dedicated voltage level shifter, such as the voltage level shifter 880 described herein with respect to FIG. 8. To turn the switch 990 to the ON state, a positive voltage can be applied at the input of the series arm 992. To turn the switch 990 to the OFF state, a negative voltage can be applied at the input of the series arm 992. In the ON state of the switch 990, a negative voltage can be provided to the shunt arms 994a, 994b. In the OFF state of the switch 990, a positive voltage can be provided to the shunt arms 994a, 994b.

When commuting the switch 990 from one state to another state, it may be advantageous to provide additional power or energy. When that operation is finished, it then may be advantageous to reduce the power consumed and/or the noise generated in the switch 990. Accordingly, charge pumps and/or voltage generators as described herein can be part of the control circuitry that provides the voltages to the series arm 992 and the shunt arms 994a, 994b. Such charge pumps dynamically activate and de-activate charge pump units to meet power and/or speed performance targets. For example, when it is advantageous to quickly switch between a positive and negative voltage (e.g., when commuting a switch between ON and OFF states), a charge pump may activate all of its charge pump units operating on different phases of a clock signal. Similarly, when it is advantageous to provide a relatively high power, a charge pump may activate all of its charge pump units. Furthermore, once the charge pump is near a targeted voltage, one or more of the charge pump units can be de-activated to reduce power consumption of the switch. In some embodiments, charge pump units with parallel charge pump units can be used where it is desirable to provide a targeted voltage and power to a switch while reducing noise from spurious tones introduced by the charge pump. This can be accomplished using the disclosed charge pumps due at least in part to the charge pump units operating on different phases of a clock signal.

Figure 10:
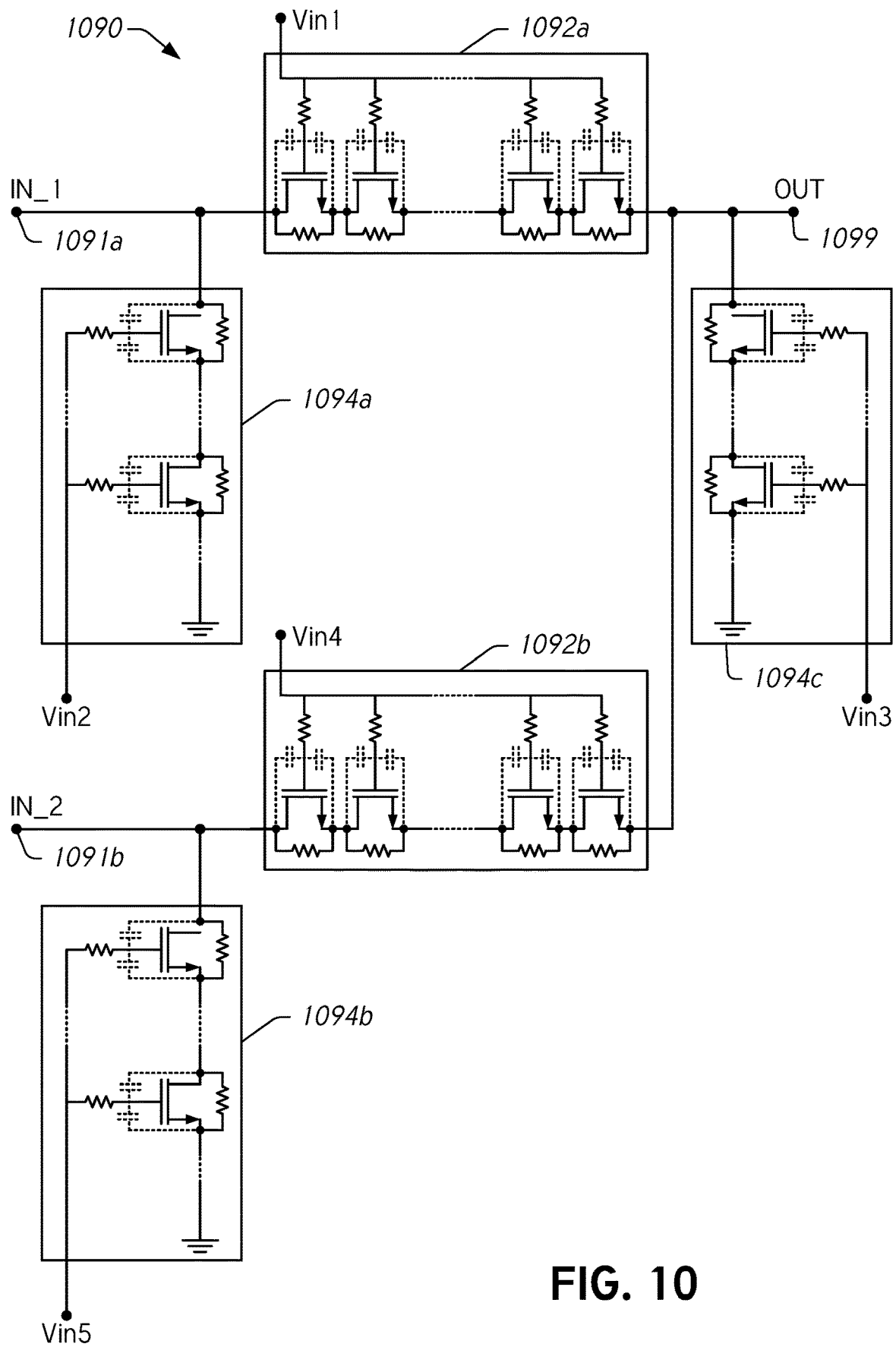
FIG. 10 illustrates a double pole, single throw switch with series arms and shunt arms.

FIG. 10 illustrates a double pole, single throw (DPST or 2PST) switch 1090 with series arms 1092a, 1092b and shunt arms 1094a-1094c. Each control voltage Vin1-Vin5 can be provided by a voltage level shifter, such as the voltage level shifter 880 described herein with respect to FIG. 8. In some embodiments, one or more of the control voltages Vin1-Vin5 can be provided by a charge pump or voltage generator, such as the charge pumps and voltage generators described herein with reference to FIGS. 1, 2, and 4-7.

The DPST switch 1090 includes a first input port 1091a and a second input port 1091b that can be selectively coupled to an output port 1099 through the series arms 1092a and 1092b, respectively. The shunt arms 1094a, 1094b can be configured to selectively isolate the input ports 1091a, 1091b as appropriate. The shunt arm 1094c can be configured to reduce leakage currents at the output port 1099. The series arm 1092a can receive a positive voltage to couple the first input 1091a to the output 1099, thereby turning the first switch arm to an ON state. The series arm 1092b can receive a positive voltage to couple the second input to the output 1099, thereby turning the second switch arm to an ON state. In each case, the other series arm can receive a negative voltage to turn that arm of the switch to the OFF state. At various times, both switch arms can be in the OFF state.

Figure 11:
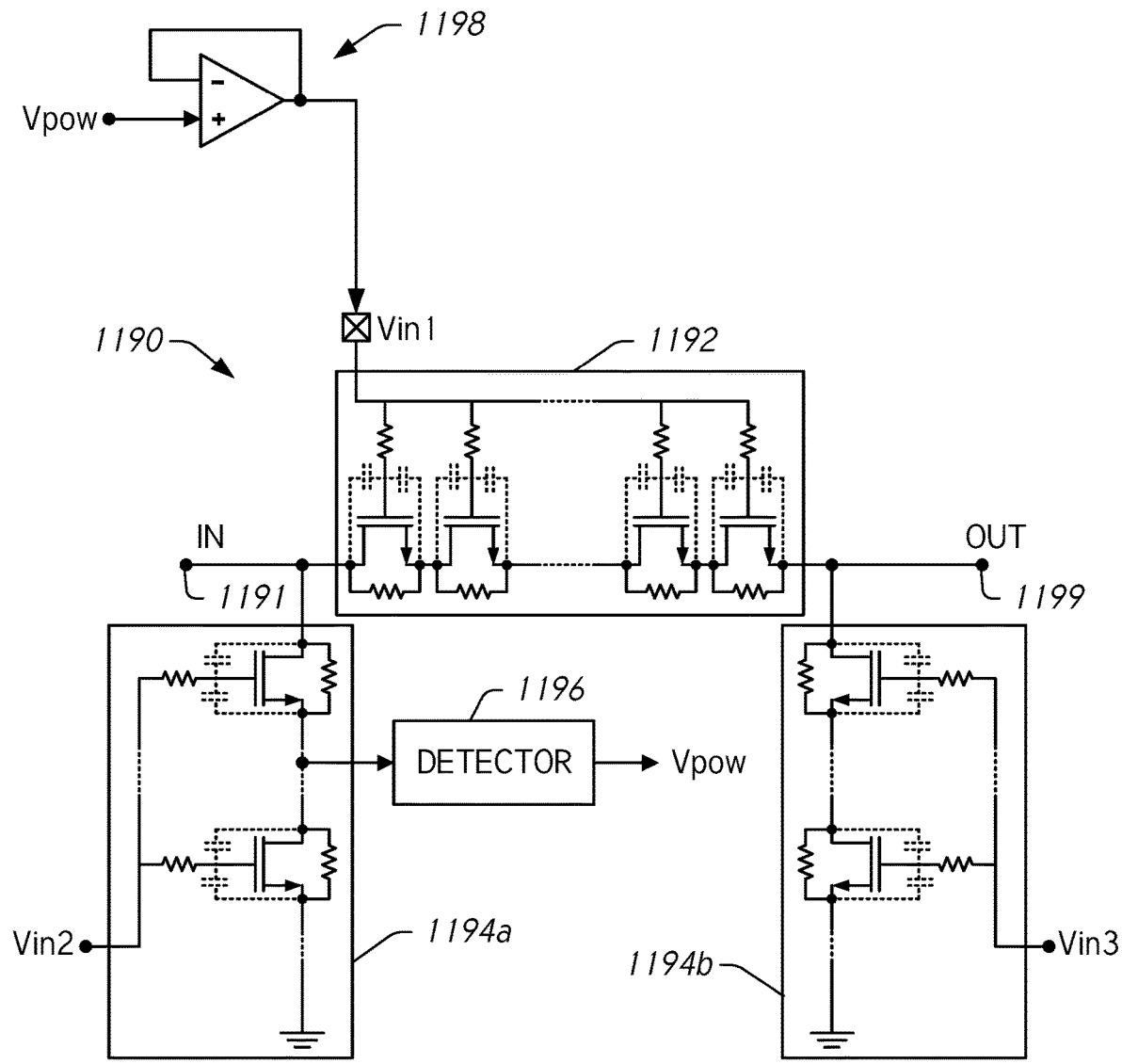
FIG. 11 illustrates a switch having a power detector to provide feedback to the control circuitry to enable dynamic control of voltages at a series arm.

FIG. 11 illustrates a switch 1190 having a power detector 1196 to provide feedback to the control circuitry to enable dynamic control of voltages at a series arm 1192. It is understood that switch performance may be improved by applying higher voltages on the gates of switch arm transistors. However, it may be disadvantageous to apply these higher voltages over long periods of time as they may cause ill effects such as device degradation. Accordingly, it may be beneficial to apply higher voltages when it positively affects switch performance at advantageous times, such as when a relatively high signal passes through a switch. Thus, the switch 1190 includes a power detector on a shunt arm 1194a configured to detect a power of the signal through the shunt arm 1194a. When a high signal is detected and the switch is to be in the ON state, the power detector 1196 can provide a signal indicating the increased power. A feedback mechanism 1198 can receive this signal from the power detector 1196 and provide increased voltage to the series arm 1192. This can advantageously reduce Ron of the switch based on detected power, which can improve harmonics.

Figure 12:
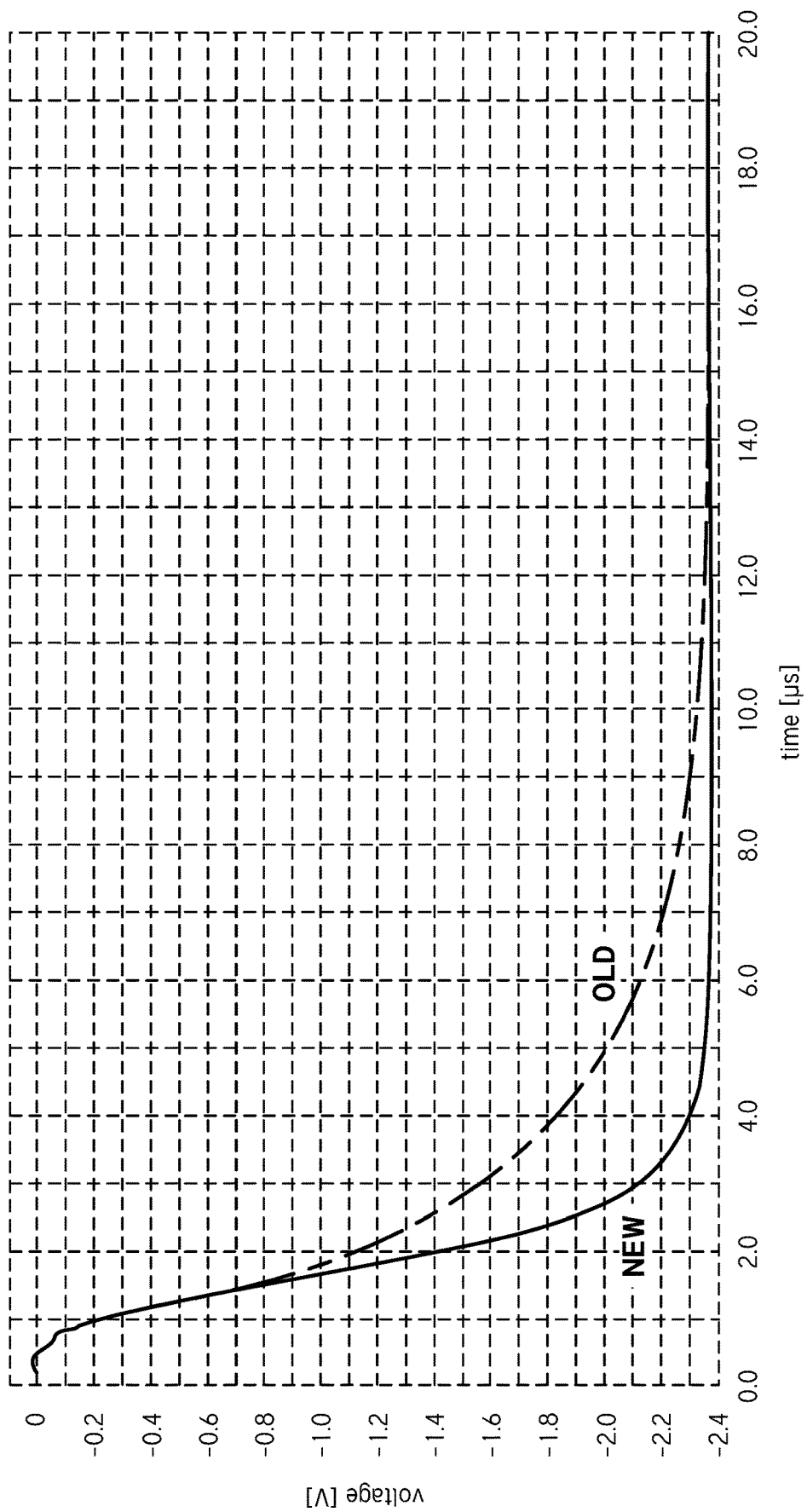
FIG. 12 illustrates a simulation of output voltage as a function of time for a typical charge pump and a charge pump having a plurality of parallel charge pump units.

FIG. 12 illustrates a simulation of output voltage as a function of time for a typical charge pump (labeled "OLD") and a charge pump having a plurality of parallel charge pump units (labeled "NEW"), examples of which are described herein with reference to FIGS. 1, 2, and 4-7. As shown in the graph, the NEW charge pump reaches the targeted voltage of −2.4 V faster than the OLD charge pump (which includes a single charge pump unit). Due at least in part to the multiple charge pump units operating on different phases of the same clock signal, the disclosed charge pumps can reach targeted voltages faster than charge pumps with a single charge pump unit or multiple charge pump units operating on the same clock frequency. As described herein, the disclosed charge pumps can be configured to operate quickly (e.g., achieve targeted voltages faster), reduce noise or spurs (e.g., by operating on different phases of a clock signal), improve power consumption by dynamically activating and de-activating parallel charge pump units, and/or increasing the strength of the charge pumps (e.g., by lower output impedance).

Implementation Considerations for Disclosed SOI Switches

The disclosed control circuitry for SOI switches may provide a number of benefits. In particular, benefits may be particularly pronounced in wireless devices that employ carrier aggregation (CA), multiple input multiple output (MIMO), and the like. Accordingly, provided herein are some examples of implementation considerations when utilizing the disclosed control circuitry and switches.

LTE-Advanced was established with a principle focus being to provide higher bitrates in a cost-efficient way and to fulfill requirements set by the standard referred to as 4G. New functionalities introduced in LTE-Advanced include carrier aggregation (CA), enhanced use of multi-antenna such as multiple input multiple output (MIMO), and support to relay nodes (RNs) for heterogeneous network planning of large and small cells. A straightforward way to increase capacity is to add more bandwidth through aggregation of carriers. Carrier aggregation can be used for both Frequency Division Duplex (FDD) and Time Division Duplex (TDD). Each aggregated carrier can have a bandwidth of 1.4, 3, 5, 10, 15 or 20 MHz and a maximum of five component carriers can be aggregated; therefore, the maximum bandwidth is 100 MHz. MIMO can be used to increase the overall bitrate through transmission of two (or more) different data streams on two (or more) different antennas. MIMO can be used when SNR (Signal to Noise ratio) is high and for situations with low SNR it may be preferable to use Tx-diversity.

LTE-Advanced Pro is the formal name of the recent 4.5G standard. The new standard includes features such as Licensed Assisted Access (LAA) and Massive Carrier Aggregation and Massive MIMO. LTE-Advanced Pro can improve network data speed reaching about 1 Gbs. The potential gain in performance for a MIMO system may be mitigated by the increased cost of the number of relatively expensive radio-frequency (RF) hardware components. To reduce the complexity of deploying MIMO technology, a complexity reduction technique known as antenna selection/swap can be applied. The antenna swap can be done through a relatively low-cost RF swap switch with dual pole dual throw (DPDT), as described in greater detail herein with reference to FIG. 3.

RF switches may be tasked to maintain the signal linearity and to provide isolation between transmit and receive chains, with the lowest insertion loss possible. Furthermore, wireless data communications have moved towards the use of higher-order modulation schemes such as OFDM and OFDMA. These modulation schemes yield waveforms that vary widely in amplitude, resulting in high peak-to-average-power-ratio (PAPR) signals that demand increased dynamic range from the components that relay and process the signals and demand relatively high linearity from the antenna switches to reduce distortion within the RF signal path.

For carrier aggregation, switch linearity and noise reduction may be of particular importance. By way of example, where a wireless device provides 2 uplink signals (e.g., 1 in a low band and 1 in a mid-band), both uplink signals may be routed to an antenna through a DPDT switch, as described herein. If the first signal is designated Tx1 and the second signal is designated Tx2, signals generated by charge pumps may produce tones which land in the receive bandwidth zone, reducing the SNR of the receive signal. Accordingly, it is advantageous to reduce noise introduced by charge pumps.

For example, based on geographical use several low band transmit/receive bands (698 MHz-960 MHz) and medium band transmit/receive bands (1427 MHz-2200 MHz) can be aggregated through two diplexers and can feed the main and/or diversity antennas using the DPDT switch. The targeted linearity for the DPDT switch is relatively high due at least in part to potential noise falling within the receive bandwidth of particular cellular frequency bands. For example, when B8 (880 MHz-915 MHz) is uplink aggregated with B3 (1710 MHz-1785 MHz) the third order term $2F_{B3}-F_{B8}$ lands in the receive band for B3 LTE FDD (1805 MHz-1880 MHz). Assuming sensitivity of a typical LTE 5 MHz (25 RBs) as about −101.5 dBm, with about 4.5 dB margin, the linearity requirement $IIP_3$ measured with two Tx1 and Tx2 signals at 23 dBm (to avoid self-jamming) is given by:

$$IIP_3 = \frac{P_{B3} + 2P_{B8} - P_{IMD}}{2} = \frac{23 + 2*23 - (-105)}{2} = 87 \text{ dBm} \quad (1)$$

Assuming a B3 Tx2 uplink signal at 23 dBm, no Tx1 signal active, and an external blocker at −15 dBm, the linearity requirement $IIP_2$ is given by:

$$IIP_2 = P_{blk} + P_{B3} - P_{IMD} = -15 + 23 - (-105) = 113 \text{ dBm} \quad (2)$$

When both uplink Tx1 and Tx2 signals are active in the presence of an agnostic blocker, the IMD product can land in the receive FDD channel. This can be referred to as "triple beat interference" and there are several scenarios to consider to determine targeted linearity performance.

RF Switches with several series FETs can handle high RF power when the switch is in the OFF state and can provide low insertion loss when the switch is in the ON state. In the OFF state, the RF port can be grounded with a switch to provide high isolation. Switch ON/OFF states can be controlled through a positive voltage ($V_{POS}$) and a negative voltage (VNEG) applied on the FET gates. In the OFF state, the stacked transistors can provide a voltage divider that limits the voltage $V_{gs}$ and $V_{gd}$ across each transistor at $V_{TX}/(2n)$. The peak RF voltage across the drain-source for each transistor (assuming equal voltage division for each FET transistor) is:

$$|V_{DS\_peak}| = 2(V_{th} - V_{NEG}) \quad (3)$$

The number of the series FETs (n) is determined on the maximum RF power applied to the switch and the breakdown requirements for CMOS/SOI transistors is determined as:

$$P_{max} = \frac{V_{Tx\_max}^2}{2*Z_0} = \frac{2(nV_{DS\_peak})^2}{Z_0} \quad (4)$$

Due at least in part to the coupling between OFF state FETs and the RF ground, there is no equally divided voltage across FETs in the OFF state and Equation (3) has to be changed to reflect the physical switch. Another method uses transient simulations to determine the voltage drop across each FET and to determine a safe region of operation. The rule of thumb for FETs operating in breakdown for RF operation is that Vds does not have to exceed two times the $V_{BV\_OXIDE}$ which is the value for DC and low frequency operation (less than 5 MHz). In the ON state, the switch presents a low insertion loss given by:

$$IL = -20 \log \frac{2Z_0}{2Z_0 + R_{on}} \quad (5)$$

The formula for $R_{on}$ is:

$$R_{on} \propto \frac{n}{W\_g(V_{POS} - V_{th})} \quad (6)$$

where $W_g$ is the FET gate width and $V_{POS}$ is the control voltage for the ON state. Also, in the ON state the voltage between gate-drain and gate-source is quasi constant and set by the $V_{POS}$ to provide isolation from gate/bulk losses. The control voltage $V_{POS}$ can be configured to not exceed the DC breakdown voltage. The resistors that provide the bias and isolation for the FETs have a relatively high value and is expressed as:

$$R_g \gg \frac{1}{2\pi(C_{gs} + C_{gd})} \quad (7)$$

Equation (7) provides the resistive part for the impedance presented by switch FETs in the ON state. A figure of metric (FOM) for switches is the product of ON resistance for the switch with its respective OFF state capacitance ($R_{on} \times C_{off}$), which is expressed in femtoseconds. Silicon on Insulator (SOI) technologies on high resistivity substrate have a FOM in a range of about 200 fs to about 120 fs. Due at least in part to improvements and desires for reduced cost and improved performance, other switch technologies such as Silicon-on-Sapphire (SOS), Gallium Arsenide (GaAs), and CMOS may be less advantageous to CMOS Silicon-on-Insulator technology to deliver high-linearity, low-loss RF switches.

As described herein, control circuitry can be directly connected to a battery or other voltage source and provide positive and negative voltages to turn the switch ON and OFF. A charge pump can be configured to generate a negative voltage Vneg where Vneg=−Vdd, with Vdd being the internal voltage generated by a voltage regulator such as an LDO. A similar circuit can be used to generate a positive voltage higher than Vdd, e.g., Vpos=2Vdd. The clock signals can be generated using a three-stage ring oscillator with the charge pump being driven by the three clock phases, each clock phase directed to a unique charge pump unit. For both positive and negative voltage generation two or more charge pumps can be cascaded which may be useful when battery voltage is low and it is desirable to overdrive a switch to get better on resistance, $R_{on}$. A benefit of using a lower internal voltage, Vdd, may be that the reverse power supply rejection reduces spurs into the power supply pins. Using all three phases of the clock signal can reduce the spurs and decrease the turn-on time for RF switches. This may be desirable where the DPDT switch is used in an asymmetrical CA uplink/downlink when the phone terminal is used simultaneous for GSM voice and LTE data with one or even two operators. The switch can provide low noise, e.g., lower than about −120 dBm for GSM.

Examples of Implementations in Products

Various examples of FET-based switch circuits and bias/coupling configurations described herein can be implemented in a number of different ways and at different product levels. Some of such product implementations are described by way of examples.

Semiconductor Die Implementation

SOI transistors utilize a positive voltage on the gate to turn the FET stack "on" and utilizes a negative bias to turn the FET stack "off." A negative voltage may be generated on chip by the disclosed charge pumps and distributed to the FETs based on a logic decode function that is also integrated on die.

Figure 13A:
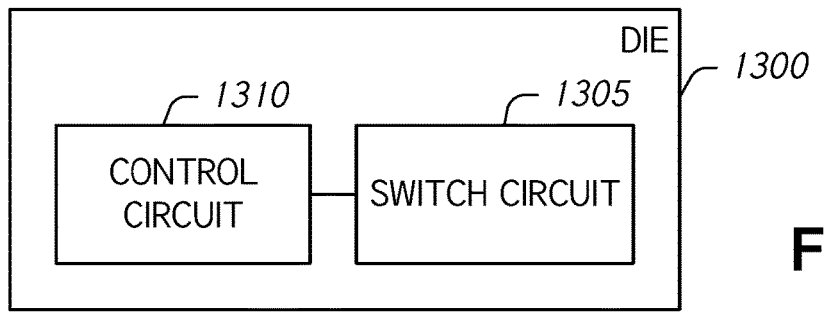
FIGS. 13A, 13B, 13C, and 13D schematically illustrate non-limiting examples of switch and control circuits with the disclosed charge pump configurations implemented on one or more semiconductor die.
Figure 13B:
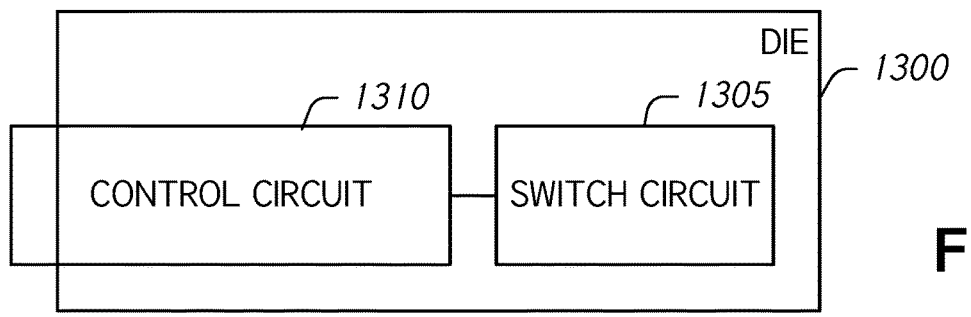
Figure 13C:
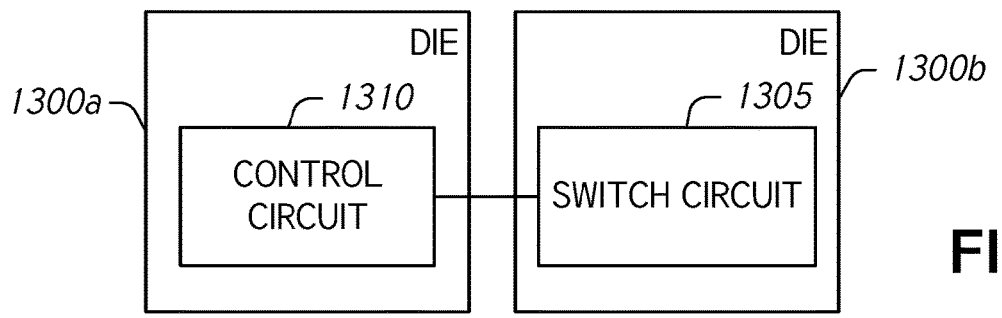
Figure 13D:
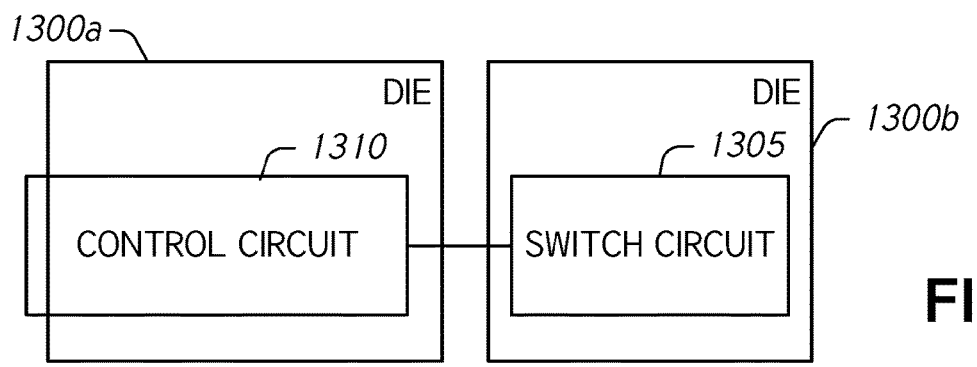

FIGS. 13A-13D schematically illustrate non-limiting examples of such implementations on one or more semiconductor die. FIG. 13A illustrates a switch circuit 1305 and a control circuit 1310 having one or more features as described implemented on a die 1300. The control circuit 1310 can include a charge pump, examples of which are described herein with reference to FIGS. 1, 2, and 4-7, and/or a voltage level shifter, examples of which are described herein with reference to FIG. 8. FIG. 13B illustrates that at least some of the control circuit 1310 can be implemented outside of the die 1300 of FIG. 13A. FIG. 13C illustrates that a switch circuit 1305 having one or more features as described herein can be implemented on a second die 1300b, and a control circuit 1310 having one or more features as described herein can be implemented on a first die 1300a. FIG. 13D illustrates that at least some of the control circuit 1310 can be implemented outside of the first die 1300a of FIG. 13C.

Packaged Module Implementation

Figure 14A:
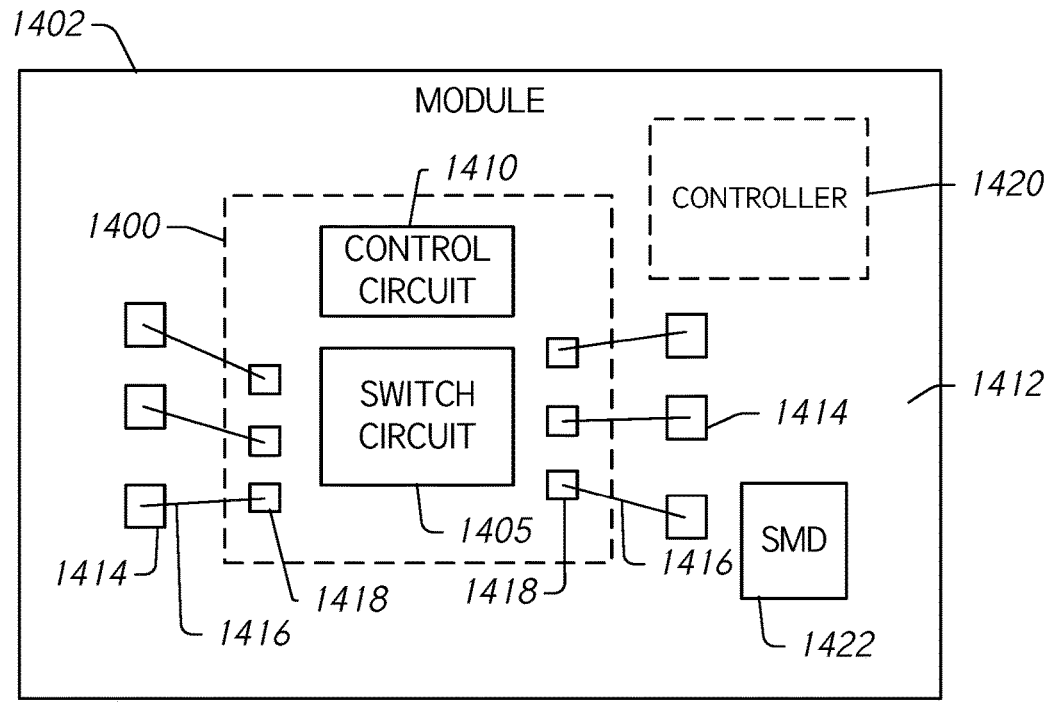
FIGS. 14A and 14B illustrate an example packaged module that includes one or more die having features described herein.

In some embodiments, one or more die having one or more features described herein can be implemented in a packaged module. An example of such a module is illustrated in FIGS. 14A (plan view) and 14B (side view). Although described in the context of both of the switch circuit and the control circuit being on the same die (e.g., example configuration of FIG. 13A), it will be understood that packaged modules can be based on other configurations.

A module 1402 is shown to include a packaging substrate 1412. Such a packaging substrate can be configured to receive a plurality of components, and can include, for example, a laminate substrate. The components mounted on the packaging substrate 1412 can include one or more dies. In the example shown, a die 1400 having a switching circuit 1405 and a control circuit 1410 is mounted on the packaging substrate 1412. The die 1400 can be electrically connected to other parts of the module (and with each other where more than one die is utilized) through connections such as connection-wirebonds 1416. Such connection-wirebonds can be formed between contact pads 1418 formed on the die 1400 and contact pads 1414 formed on the packaging substrate 1412. In some embodiments, one or more surface mounted devices (SMDs) 1422 can be mounted on the packaging substrate 1412 to facilitate various functionalities of the module 1402.

In some embodiments, the packaging substrate 1412 can include electrical connection paths for interconnecting the various components with each other and/or with contact pads for external connections. For example, a connection path 1432 is depicted as interconnecting the example SMD 1422 and the die 1400. In another example, a connection path 1432 is depicted as interconnecting the SMD 1422 with an external-connection contact pad 1434. In yet another example, a connection path 1432 is depicted as interconnecting the die 1400 with ground-connection contact pads 1436.

In some embodiments, a space above the packaging substrate 1412 and the various components mounted thereon can be filled with an overmold structure 1430. Such an overmold structure can provide a number of desirable functionalities, including protection for the components and wirebonds from external elements, and easier handling of the packaged module 1402.

Figure 14B:
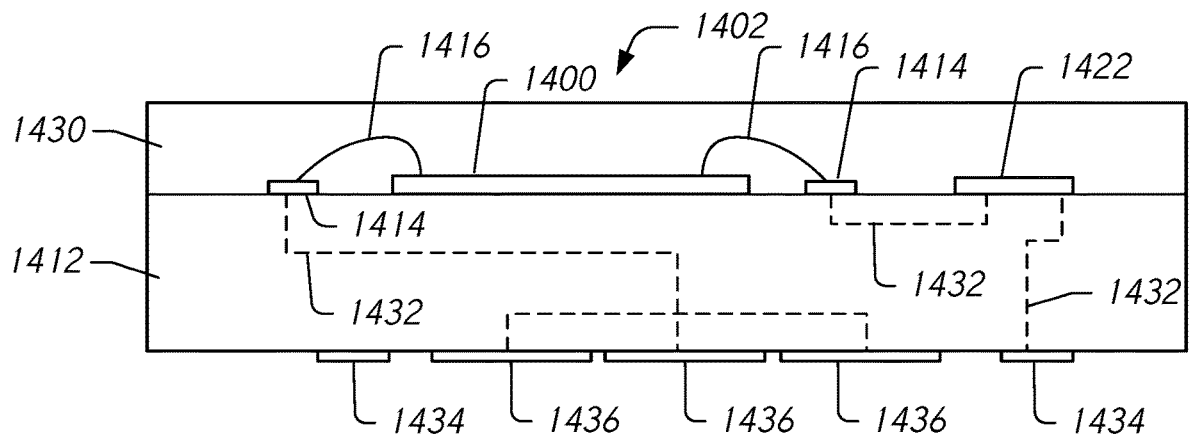
Figure 15:
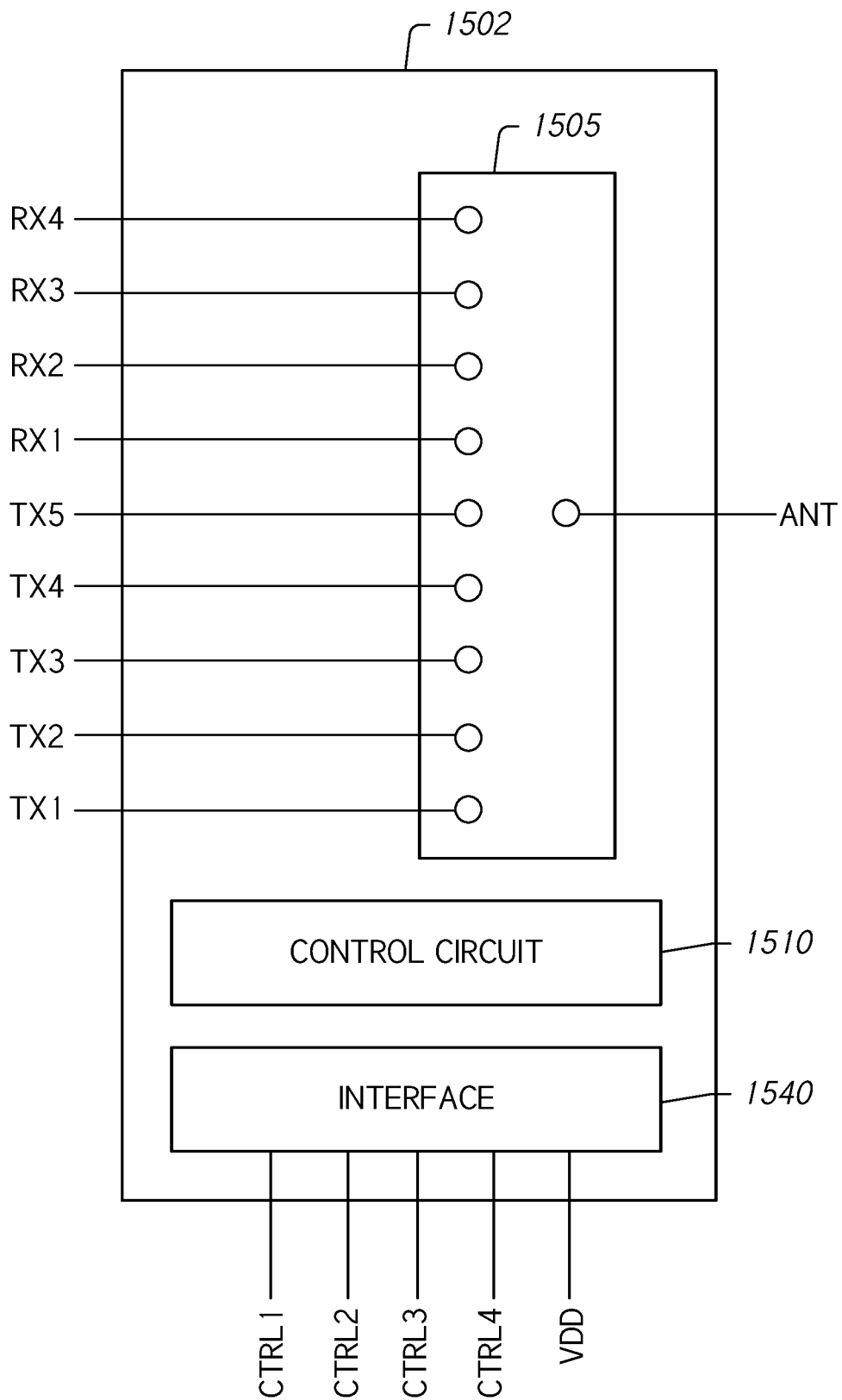
FIG. 15 illustrates a schematic diagram of an example switching configuration that can be implemented in the module of FIGS. 14A and 14B.

FIG. 15 illustrates a schematic diagram of an example switching configuration that can be implemented in the module 1402 described in reference to FIGS. 14A and 14B. In the example, the switch circuit 1505 is depicted as being an SP9T switch, with the pole being connectable to an antenna and the throws being connectable to various Rx and Tx paths. Such a configuration can facilitate, for example, multi-mode multi-band operations in wireless devices.

The module 1502 can further include an interface for receiving power (e.g., supply voltage VDD) and control signals to facilitate operation of the switch circuit 1505 and/or the control circuit 1510. In some implementations, supply voltage and control signals can be applied to the switch circuit 1505 via the control circuit 1510 through an interface 1540.

Figure 16:
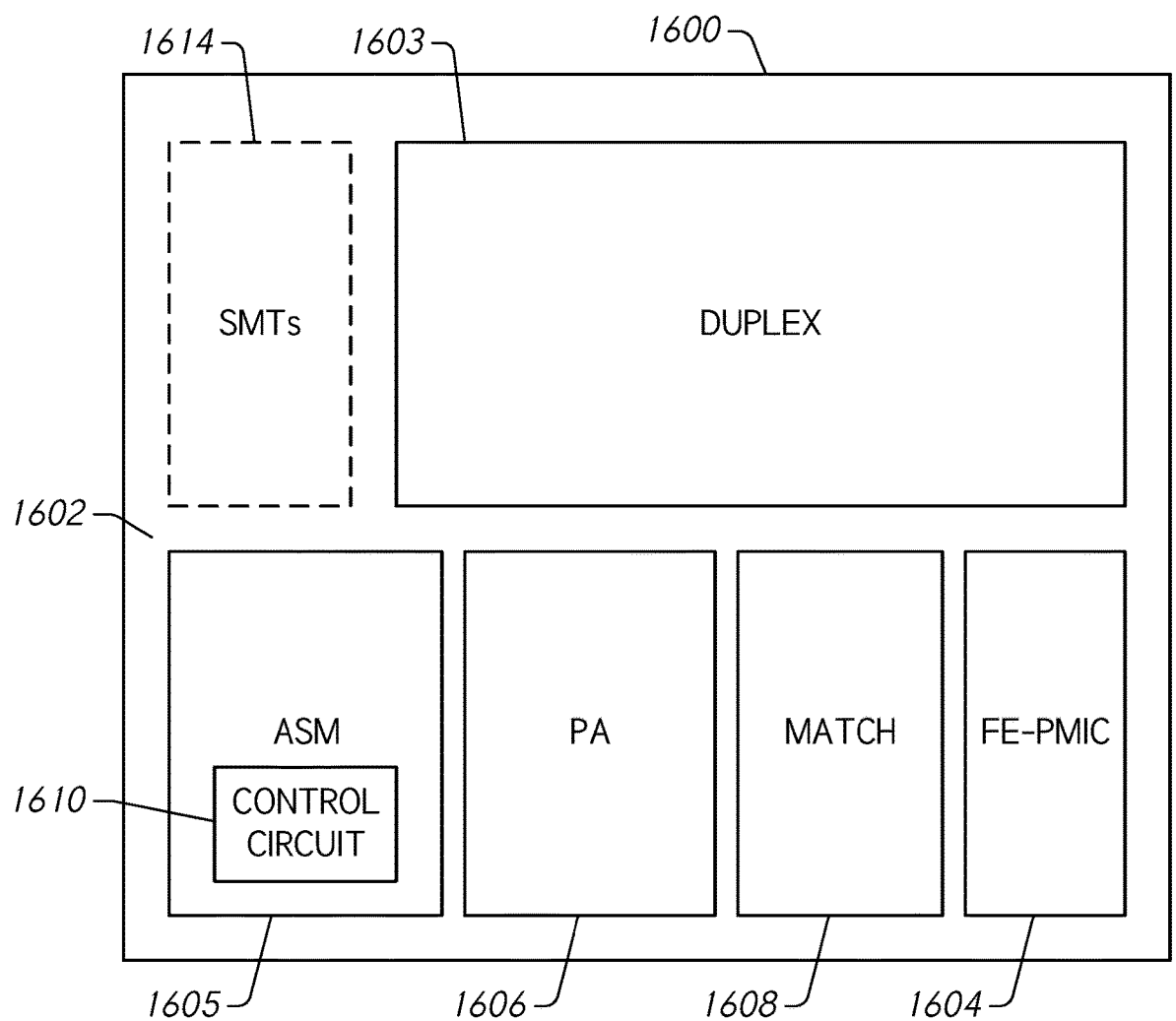
FIG. 16 illustrates that, in some embodiments, some or all of the devices having one or more features as described herein may be implemented in a module.

FIG. 16 illustrates that, in some embodiments, some or all of the devices having one or more features as described herein may be implemented in a module. Such a module may be, for example, a front-end module (FEM). In the example of FIG. 16, a radio frequency (RF) module 1600 can include a packaging substrate 1602, and a number of components may be mounted on such a packaging substrate. For example, a front-end power management integrated circuit (FE-PMIC) component 1604, a power amplifier assembly 1606, a match component 1608, and a duplexer assembly 1603 may be mounted and/or implemented on and/or within the packaging substrate 1602. The FE-PMIC component 1604 includes a supply which may be a power supply (e.g., a battery, a voltage/power source) and/or may be coupled to a power supply. Other components such as a number of surface mount technology (SMT) devices 1614 can also be mounted on the packaging substrate 1602. An antenna switch circuit 1605 can be implemented on the packaging substrate 1602, wherein the antenna switch circuit 1605 includes a control circuit 1610 having one or more charge pumps as described herein. Although all of the various components are depicted as being laid out on the packaging substrate 1602, it will be understood that some component(s) may be implemented over other component(s). In some embodiments, the components of the RF module 1600 and one or more serial buses/interfaces (e.g., a RFFE bus/interface) used by the components of the RF module 1600 may implement and/or perform one or more features as described herein.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 17:
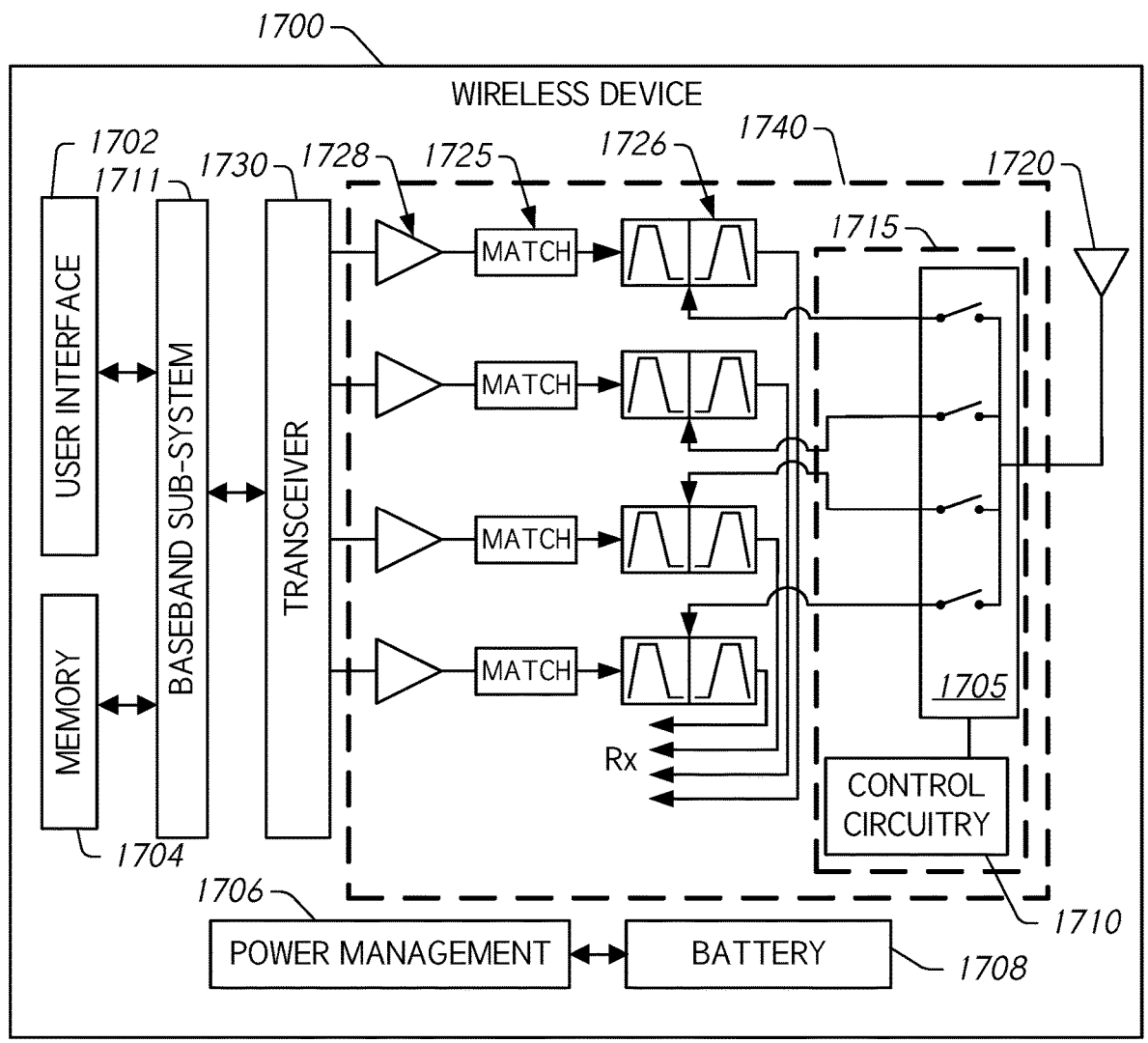
FIG. 17 schematically depicts an example wireless device having one or more advantageous features described herein.

FIG. 17 schematically depicts an example wireless device 1700 having one or more advantageous features described herein. In the context of various switches and various control circuit configurations as described herein, a switch 1705 and a control circuit 1710 can be part of a switch module 1715 integrated into a front end module 1740. In some embodiments, such a switch module 1715 can facilitate, for example, multi-band multi-mode operation of the wireless device 1700.

In the example wireless device 1700, power amplifiers 1728 can provide an amplified RF signal to the switch 1705 via diplexers 1726. The switch 1705 can route the amplified RF signal to an antenna 1720. The PAs 1728 can receive an unamplified RF signal from a transceiver 1730 that can be configured and operated in known manners. The transceiver 1730 can also be configured to process received signals. The transceiver 1730 is shown to interact with a baseband sub-system 1711 that is configured to provide conversion between data and/or voice signals suitable for a user and RF signals suitable for the transceiver 1730. The transceiver 1730 is also shown to be connected to a power management component 1706 that is configured to manage power from a battery 1708 for the operation of the wireless device 1700. Such a power management component can also control operations of the baseband sub-system 1711 and the module 1740.

The baseband sub-system 1711 is shown to be connected to a user interface 1702 to facilitate various input and output of voice and/or data provided to and received from the user. The baseband sub-system 1711 can also be connected to a memory 1704 that is configured to store data and/or instructions to facilitate the operation of the wireless device, and/or to provide storage of information for the user.

In some embodiments, the diplexers 1726 can allow transmit and receive operations to be performed simultaneously using a common antenna (e.g., antenna 1720). Received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The implementations described herein may be used for various broadband wireless communication systems, including communication systems that are based on an orthogonal multiplexing scheme. Examples of such communication systems include Spatial Division Multiple Access (SDMA), Time Division Multiple Access (TDMA), Orthogonal Frequency Division Multiple Access (OFDMA) systems, Single-Carrier Frequency Division Multiple Access (SC-FDMA) systems, and so forth. An SDMA system may utilize sufficiently different directions to simultaneously transmit data belonging to multiple user terminals. A TDMA system may allow multiple user terminals to share the same frequency channel by dividing the transmission signal into different time slots, each time slot being assigned to different user terminal. A TDMA system may implement GSM (Global System for Mobile Communications) or some other standards known in the art. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An OFDM system may implement IEEE 802.11 or some other standards known in the art. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA. A SC-FDMA system may implement 3GPP-LTE (3rd Generation Partnership Project Long Term Evolution), LTE-Advanced, LTE-Advanced Pro (4.5G) or any other standards and/or ad hoc wireless techniques known in the art.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations, an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), a smart phone, a tablet computing device or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), an entertainment device (e.g., a music or video device, or a satellite radio), a global positioning system device, or any other suitable device that is configured to communicate via a wireless or wired medium. In some aspects, the node is a wireless node. Such wireless node may provide, for example, connectivity for or to a network (e.g., a wide area network such as the Internet or a cellular network) via a wired or wireless communication link.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A voltage generator comprising:
a first charge pump having a first voltage terminal, a ground terminal coupled to a reference potential node, and a first plurality of charge pump units that are coupled in parallel to one another, each charge pump unit of the first plurality of charge pump units configured to receive a supply voltage, to receive a clock signal offset in phase from clock signals to the other charge pump units, and to generate a first output signal based on the received clock signal that is coupled to the first voltage terminal, the first charge pump further including an output resistor coupled in series with each charge pump unit, each output resistor having the same resistance value;
a second charge pump having a second voltage terminal, an intermediate voltage terminal coupled to the first voltage terminal of the first charge pump to receive the first output signal from the first charge pump unit, and a second plurality of charge pump units that are coupled in parallel to one another, each charge pump unit of the second plurality of charge pump units configured to receive a supply voltage, to receive a clock signal offset in phase from clock signals to the other charge pump units, and to generate a second output signal based on the received clock signal that is coupled to the second voltage terminal, the second output signal being a voltage that is greater in magnitude than the first output signal from the first charge pump unit, the second charge pump further including an output resistor coupled in series with each charge pump unit, each output resistor having the same resistance value.

2. The voltage generator of claim 1 further comprising a control module configured to generate a plurality of control signals, individual charge pump units of the first charge pump and the second charge pump configured to receive individual control signals and to activate or deactivate based on the received individual control signal.

3. The voltage generator of claim 2 wherein the control module is configured to selectively de-activate charge pump units during operation to reduce output power of the voltage generator.

4. The voltage generator of claim 2 wherein the control module is configured to selectively activate charge pump units during operation to increase a speed of generating a targeted output voltage at the second voltage terminal.

5. The voltage generator of claim 2 wherein the control module is configured to selectively de-activate an increasing number of charge pump units as the second output signal approaches a targeted output voltage.

6. The voltage generator of claim 1 further comprising a third charge pump unit having a third voltage terminal, a second intermediate voltage terminal coupled to the second voltage terminal of the second charge pump to receive the second output signal from the second charge pump unit, and a third plurality of charge pump units that are coupled in parallel to one another, each charge pump unit of the third plurality of charge pump units configured to receive a supply voltage, to receive a clock signal offset in phase from clock signals to the other charge pump units, and to generate a third output signal based on the received clock signal that is coupled to the third voltage terminal, the third output signal being a voltage that is greater in magnitude than the second output signal from the second charge pump unit.

7. The voltage generator of claim 1 wherein the first plurality of charge pump units includes at least three charge pump units and the second plurality of charge pump units includes at least three charge pump units.

8. The voltage generator of claim 1 wherein the second output signal is a positive voltage.

9. The voltage generator of claim 1 wherein the second output signal is a negative voltage.

10. A control circuit of a switch, the control circuit comprising the voltage generator of claim 1 coupled to a level shifter, the level shifter configured to receive the second output signal from the voltage generator and to output a voltage value to the switch.

11. A radio-frequency (RF) module comprising:
a packaging substrate configured to receive a plurality of components; and
a voltage generator implemented on the packaging substrate, the voltage generator including a first charge pump having a first voltage terminal, a ground terminal coupled to a reference potential node, and a first plurality of charge pump units that are coupled in parallel to one another, each charge pump unit of the first plurality of charge pump units configured to receive a supply voltage, to receive a clock signal offset in phase from clock signals to the other charge pump units, and to generate a first output signal based on the received clock signal that is coupled to the first voltage terminal, the first charge pump further including an output resistor coupled in series with each charge pump unit, each output resistor having the same resistance value; the voltage generator also including a second charge pump having a second voltage terminal, an intermediate voltage terminal coupled to the first voltage terminal of the first charge pump to receive the first output signal from the first charge pump unit, and a second plurality of charge pump units that are coupled in parallel to one another, each charge pump unit of the second plurality of charge pump units configured to receive a supply voltage, to receive a clock signal offset in phase from clock signals to the other charge pump units, and to generate a second output signal based on the received clock signal that is coupled to the second voltage terminal, the second output signal being a voltage that is greater in magnitude than the first output signal from the first charge pump unit, the second charge pump further including an output resistor coupled in series with each charge pump unit, each output resistor having the same resistance value.

12. The RF module of claim 11 further comprising a control module implemented on the packaging substrate, the control module configured to generate a plurality of control signals, individual charge pump units of the first charge pump and the second charge pump configured to receive individual control signals and to activate or deactivate based on the received individual control signal.

13. The RF module of claim 12 wherein the control module is configured to selectively de-activate charge pump units during operation to reduce output power of the voltage generator.

14. The RF module of claim 12 wherein the control module is configured to selectively activate charge pump units during operation to increase a speed of generating a targeted output voltage at the second voltage terminal.

15. The RF module of claim 12 wherein the control module is configured to selectively de-activate an increasing number of charge pump units as the second output signal approaches a targeted output voltage.

16. The RF module of claim 11 wherein the RF module is a front-end module.

17. A wireless device comprising:
a transceiver configured to generate a radio-frequency (RF) signal;
a front-end module (FEM) in communication with the transceiver, the FEM including a packaging substrate configured to receive a plurality of components, the FEM further including a voltage generator implemented on the packaging substrate, the voltage generator including a first charge pump having a first voltage terminal, a ground terminal coupled to a reference potential node, and a first plurality of charge pump units that are coupled in parallel to one another, each charge pump unit of the first plurality of charge pump units configured to receive a supply voltage, to receive a clock signal offset in phase from clock signals to the other charge pump units, and to generate a first output signal based on the received clock signal that is coupled to the first voltage terminal, the first charge pump further including an output resistor coupled in series with each charge pump unit, each output resistor having the same resistance value; the voltage generator also including a second charge pump having a second voltage terminal, an intermediate voltage terminal coupled to the first voltage terminal of the first charge pump to receive the first output signal from the first charge pump unit, and a second plurality of charge pump units that are coupled in parallel to one another, each charge pump unit of the second plurality of charge pump units configured to receive a supply voltage, to receive a clock signal offset in phase from clock signals to the other charge pump units, and to generate a second output signal based on the received clock signal that is coupled to the second voltage terminal, the second output signal being a voltage that is greater in magnitude than the first output signal from the first charge pump unit, the second charge pump further including an output resistor coupled in series with each charge pump unit, each output resistor having the same resistance value; and
an antenna in communication with the FEM, the antenna configured to transmit an amplified RF signal.

18. The wireless device of claim 17 further comprising a switch and a level shifter that is coupled to the voltage generator, the switch operated based on a voltage signal received from the level shifter.

19. The wireless device of claim 18 wherein the level shifter is configured to receive the second output signal from the voltage generator and to output the voltage signal to the switch to control the switch.

20. The wireless device of claim 19 wherein the level shifter is configured to output a negative voltage to turn the switch off and to output a positive voltage to turn the switch on.

* * * * *